(12) United States Patent
Rho

(10) Patent No.: US 11,961,874 B2
(45) Date of Patent: Apr. 16, 2024

(54) DISPLAY DEVICE AND METHOD OF MANUFACTURING THE SAME

(71) Applicant: Samsung Display Co., Ltd., Yongin-si (KR)

(72) Inventor: Soo Guy Rho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 406 days.

(21) Appl. No.: 17/447,177

(22) Filed: Sep. 8, 2021

(65) Prior Publication Data
US 2022/0173155 A1 Jun. 2, 2022

(30) Foreign Application Priority Data

Nov. 30, 2020 (KR) ........................ 10-2020-0164558

(51) Int. Cl.
| | |
|---|---|
| *H01L 27/15* | (2006.01) |
| *H01L 33/00* | (2010.01) |
| *H01L 33/24* | (2010.01) |
| *H01L 33/38* | (2010.01) |
| *H01L 33/40* | (2010.01) |
| *H01L 33/44* | (2010.01) |
| *G09G 3/3233* | (2016.01) |

(52) U.S. Cl.
CPC ........ *H01L 27/156* (2013.01); *H01L 33/0093* (2020.05); *H01L 33/24* (2013.01); *H01L 33/38* (2013.01); *H01L 33/405* (2013.01); *H01L 33/44* (2013.01); *G09G 3/3233* (2013.01); *G09G 2300/0426* (2013.01); *G09G 2300/0842* (2013.01); *H01L 2933/0016* (2013.01)

(58) Field of Classification Search
CPC ... H01L 27/156; H01L 33/0093; H01L 33/24; H01L 33/38; H01L 33/405; H01L 33/44; H01L 2933/0016; H01L 25/0753; H01L 25/167; H01L 33/20; H01L 33/08; H01L 33/60; H01L 21/52; H01L 27/1214; H01L 33/005; H01L 33/04; H01L 33/62; G09G 2300/0426; G09G 2300/0842; G09G 3/3258
See application file for complete search history.

(56) References Cited

U.S. PATENT DOCUMENTS

| | | | | |
|---|---|---|---|---|
| 2014/0306241 | A1* | 10/2014 | Hirakata | ................ H10K 50/86 257/79 |
| 2015/0090991 | A1* | 4/2015 | Ishii | .................... H10K 50/865 257/40 |

FOREIGN PATENT DOCUMENTS

KR 10-2016-0013443 A 2/2016

* cited by examiner

*Primary Examiner* — Mohammed R Alam
(74) *Attorney, Agent, or Firm* — Lewis Roca Rothgerber Christie LLP

(57) ABSTRACT

A display device may include a first electrode on a substrate, a bank covering edges of the first electrode, a plurality of light-emitting elements on the first electrode and aligned vertically with respect to the first electrode, a conductive polymer layer on the first electrode to fill gaps between the plurality of light-emitting elements, an insulating layer on the conductive polymer layer to fill the gaps between the plurality of light-emitting elements, and a second electrode on the bank, the insulating layer, and the plurality of light-emitting elements.

20 Claims, 27 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2020-0164558, filed in the Korean Intellectual Property Office on Nov. 30, 2020, the entire content of which is incorporated herein by reference.

BACKGROUND

1. Field

One or more embodiments of the present disclosure relate to a display device and a method of manufacturing the same.

2. Description of the Related Art

Display devices are becoming more important with developments in multimedia technology. Accordingly, various display devices such as an organic light-emitting diode (OLED) display device, a liquid crystal display (LCD) device, and/or the like have been used.

A display device includes a display panel such as an OLED display panel or an LCD panel that can display an image. A display panel includes light-emitting elements such as light-emitting diodes (LED), and the LEDs may be classified into OLEDs using an organic material as, for example, a fluorescent substance and inorganic LEDs using an inorganic material as a fluorescent substance.

SUMMARY

One or more embodiments of the present disclosure provide a display device capable of facilitating the alignment of light-emitting elements and improving optical efficiency and a method of fabricating the display device.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to one or more embodiments of the present disclosure, the display device may include a first electrode on a substrate, a bank covering edges of the first electrode, a plurality of light-emitting elements on the first electrode and aligned vertically with respect to the first electrode, a conductive polymer layer on the first electrode to fill gaps between adjacent ones of the plurality of light-emitting elements, an insulating layer on the conductive polymer layer to fill the gaps between adjacent ones of the plurality of light-emitting elements, and a second electrode on the bank, the insulating layer, and the plurality of light-emitting elements.

In one or more embodiments, first end portions of the plurality of light-emitting elements may be in contact with the first electrode.

In one or more embodiments, the plurality of light-emitting elements may include lower portions and upper portions, which are defined relative to a reference line that crosses a length direction of the plurality of light-emitting elements and passes through about 50% of a length of the plurality of light-emitting elements.

In one or more embodiments, the conductive polymer layer may be in contact with the lower portions of the plurality of light-emitting elements, and a thickness of the conductive polymer layer may be about 20% to about 40% of the length of the plurality of light-emitting elements.

In one or more embodiments, the insulating layer may be in contact with the upper portions of the plurality of light-emitting elements and may expose second end portions of the plurality of light-emitting elements.

In one or more embodiments, a thickness of the insulating layer may be about 40% to about 70% of the length of the plurality of light-emitting elements.

In one or more embodiments, second end portions of the plurality of light-emitting elements may be in contact with the second electrode.

In one or more embodiments, the plurality of light-emitting elements may be spaced apart from one another and may be at irregular intervals.

In one or more embodiments, a length of the plurality of light-emitting elements may be smaller than a thickness of the bank.

In one or more embodiments, second end portions of the plurality of light-emitting elements may protrude above a top surface of the insulating layer.

In one or more embodiments, second end portions of the plurality of light-emitting elements may be aligned and coincide with a top surface of the insulating layer.

In one or more embodiments, the display device may further include a reflective electrode between the first electrode and the plurality of light-emitting elements, wherein the reflective electrode is in contact with a top surface of the first electrode and side surfaces of the bank.

In one or more embodiments, the insulating layer may cover the reflective electrode.

In one or more embodiments, each of the plurality of light-emitting elements may include a first semiconductor layer, a second semiconductor layer, and at least one light-emitting layer between the first semiconductor layer and the second semiconductor layer, and the first semiconductor layer, the second semiconductor layer, and the at least one light-emitting layer may be surrounded by an insulating film.

According to one or more embodiments of the disclosure, the method of manufacturing a display device may include growing a plurality of light-emitting elements on a base substrate, attaching a polymer film including porogen on the plurality of light-emitting elements, forming a polymer layer, which surrounds first end portions of the plurality of light-emitting elements, by heat-treating the base substrate to melt the polymer film, separating the plurality of light-emitting elements and mixing the plurality of light-emitting elements in light-emitting element ink including a conductive polymer, preparing a target substrate, including a first electrode and a bank, and applying the light-emitting element ink on the first electrode, forming a conductive polymer layer on the first electrode by drying the light-emitting element ink, and aligning the plurality of light-emitting elements vertically with respect to the first electrode, forming an insulating layer on the conductive polymer layer, removing the polymer layer from the plurality of light-emitting elements, and forming a second electrode on the plurality of light-emitting elements.

In one or more embodiments, the polymer film may be fabricated with a polymer resin composition including a polymer resin and the porogen, the polymer resin is included in an amount of about 15% to about 30% by weight with respect to 100% by weight of the polymer resin composition, and the porogen is included in an amount of about 10% to about 40% by weight with respect to 100% by weight of the polymer resin.

In one or more embodiments, the light-emitting element ink may be prepared by mixing the plurality of light-emitting elements, the conductive polymer, and the solvent.

In one or more embodiments, the light-emitting element ink and the insulating layer may be applied by inkjet printing.

In one or more embodiments, if the light-emitting element ink is applied on the first electrode, the polymer layer formed at the first end portions of the plurality of light-emitting elements may float above a surface of the light-emitting element ink and the plurality of light-emitting elements may be aligned vertically with respect to the first electrode, and in the drying the light-emitting element ink, the conductive polymer may be formed into a conductive polymer layer, and the plurality of light-emitting elements may be settled on the first electrode in a state of being aligned vertically with respect to the first electrode.

According to one or more embodiments of the disclosure, the method of manufacturing a display device may include growing a plurality of light-emitting elements on a base substrate, attaching a polymer film including porogen on the plurality of light-emitting elements, forming a polymer layer, which surrounds first end portions of the plurality of light-emitting elements, by heat-treating the base substrate to melt the polymer film, separating the plurality of light-emitting elements and mixing the plurality of light-emitting elements in light-emitting element ink including a conductive polymer, preparing a substrate including a first electrode and a bank, forming a reflective material layer on the first electrode and the bank, applying the light-emitting element ink on the reflective material layer, aligning a conductive polymer layer and the plurality of light-emitting elements on the reflective material layer by drying the light-emitting element ink, etching away the polymer layer from the plurality of light-emitting elements, and forming a reflective electrode by etching the reflective material layer, forming an insulating layer on the conductive polymer layer and the reflective electrode, and forming a second electrode on the plurality of light-emitting elements.

According to the aforementioned and other embodiments of the present disclosure, a new display device using light-emitting elements can be provided.

In addition, a display device including light-emitting elements vertically aligned between two electrodes can be easily fabricated.

Moreover, as a reflective electrode is capable of reflecting light from light-emitting elements, the emission efficiency of the light-emitting elements can be improved.

Other features and embodiments may be apparent from the following detailed description, the drawings, and the claims.

BRIEF DESCRIPTION OF THE DRAWINGS

The above and other embodiments and features of the present disclosure will become more apparent by describing in more detail embodiments thereof with reference to the attached drawings, in which.

DETAILED DESCRIPTION

Figure 1:
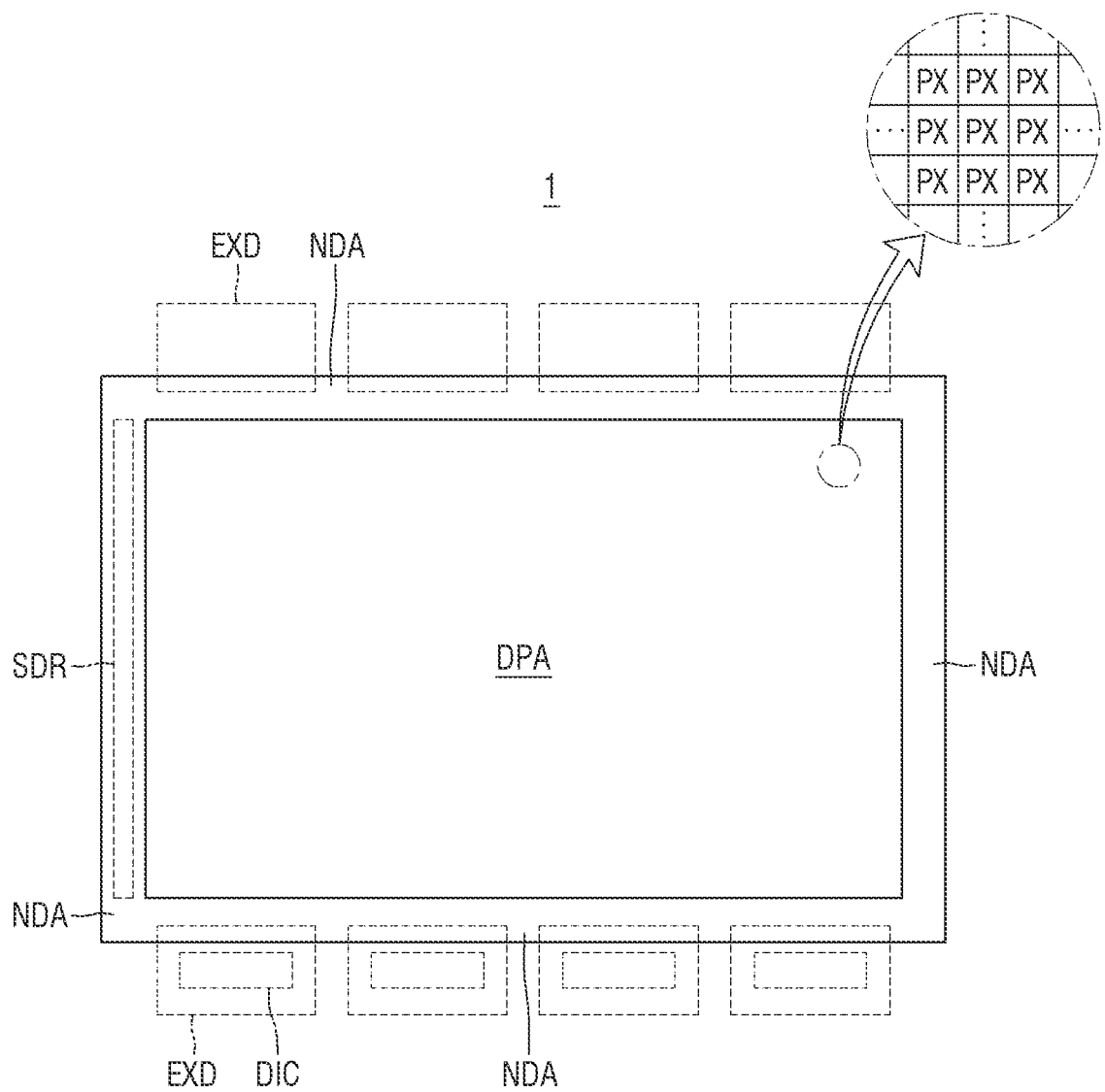
FIG. 1 is a plan view of a display device according to one or more embodiments of the present disclosure.

The subject matter of the present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (without intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Each of the features of the various embodiments of the present disclosure may be combined or combined with each other, in part or in whole, and technically various interlocking and driving are possible. Each embodiment may be implemented independently of each other or may be implemented together in an association.

Embodiments of the present disclosure will hereinafter be described with reference to the accompanying drawings.

FIG. 1 is a plan view of a display device according to one or more embodiments of the present disclosure.

Referring to FIG. 1, a display device 1 may be applicable to a smartphone, a mobile phone, a tablet personal computer (PC), a personal digital assistant (PDA), a portable multimedia player (PMP), a television (TV), a gaming console, a wristwatch-type electronic device, a head-mounted display (HMD), a PC monitor, a laptop computer, a car navigation device, a car dashboard, a digital camera, a camcorder, an external billboard, an electronic display board, a medical device, an inspection device, and/or various suitable home appliances (such as a refrigerator and/or a washing machine), but the present disclosure is not limited thereto. It will hereinafter be described that the display device 1 is, for example, a TV having a high or ultrahigh resolution (such as High Definition (HD), Ultra-High Definition (UHD), 4K or 8K), but the present disclosure is not limited thereto.

The display device 1 may be classified in various suitable manners depending on how it displays an image. The display device 1 may be, for example, an organic light-emitting diode (OLED) display device, an inorganic light-emitting diode (LED) display device, a quantum dot emitting (QED) display device, a micro-LED display device, a nano-LED display device, a plasma display panel (PDP) device, a field emission display (FED) device, a cathode ray tube (CRT) display device, a liquid crystal display (LCD) device, and/or an electrophoretic display (EPD) device. It will hereinafter be described that the display device 1 is, for example, an OLED display device, and an OLED display device will hereinafter be referred to simply as a display device unless specified otherwise. However, the present disclosure is not limited to this, and various other suitable display devices may also be applicable to the display device 1 without departing from the scope of the present disclosure.

The display device 1 may have a square shape, or, for example, a rectangular shape, in a plan view. In a case where the display device 1 is a TV, the long sides of the display device 1 may be arranged in a horizontal direction, but the present disclosure is not limited thereto. In one or more embodiments, the long sides of the display device 1 may be arranged in a vertical direction, or the display device 1 may be rotatably installed so that the long sides thereof may be arranged horizontally or vertically.

The display device 1 may include a display area DPA and a non-display area NDA. The display area DPA may be an active area in which an image is displayed. The display area DPA may have a similar shape to the display device 1, for example, a rectangular shape, in a plan view, but the present disclosure is not limited thereto.

The display area DPA may include a plurality of pixels PX. The pixels PX may be arranged in row and column directions. The pixels PX may have a rectangular or square shape in a plan view, but the present disclosure is not limited thereto. In one or more embodiments, the pixels PX may have a rhombus shape having sides inclined with respect to the directions of the sides of the display device 1. The pixels PX may include pixels PX of various suitable colors. In one or more example embodiments, the pixels PX may include a first-color pixel PX (e.g., a red pixel), a second-color pixel PX (e.g., a green pixel), and a third-color pixel PX (e.g., a blue pixel). The first-color pixel PX, the second-color pixel PX, and the third-color pixel PX may be alternately arranged in a stripe or PenTile®/PENTILE® pattern or fashion (PENTILE® is a registered trademark owned by Samsung Display Co., Ltd.).

The non-display area NDA may be around the display area DPA. The non-display area NDA may surround portion of the display area DPA or the entire display area DPA. The display area DPA may have a rectangular shape, and the non-display area NDA may be adjacent to the four sides of the display area DPA. The non-display area NDA may form the bezel of the display device 1.

In the non-display area NDA, driving circuits or elements for driving the display area DPA may be provided. In one or more example embodiments, in first and second non-display areas adjacent to first and second long sides (e.g., the bottom and top sides), respectively, of the display device 1, pad units may be provided on a display substrate of the display device 1, and external devices EXD may be mounted on pad electrodes of the pad units. Examples of the external devices EXD include connecting films, printed circuit boards (PCBs), driver integrated circuits DIC, connectors and wiring connecting films. In one or more example embodiments, in a third non-display area NDA adjacent a first short side (e.g., the left side) of the display device 1, a scan driver SDR may be provided and may be formed directly on the display substrate of the display device 1.

Figure 2:
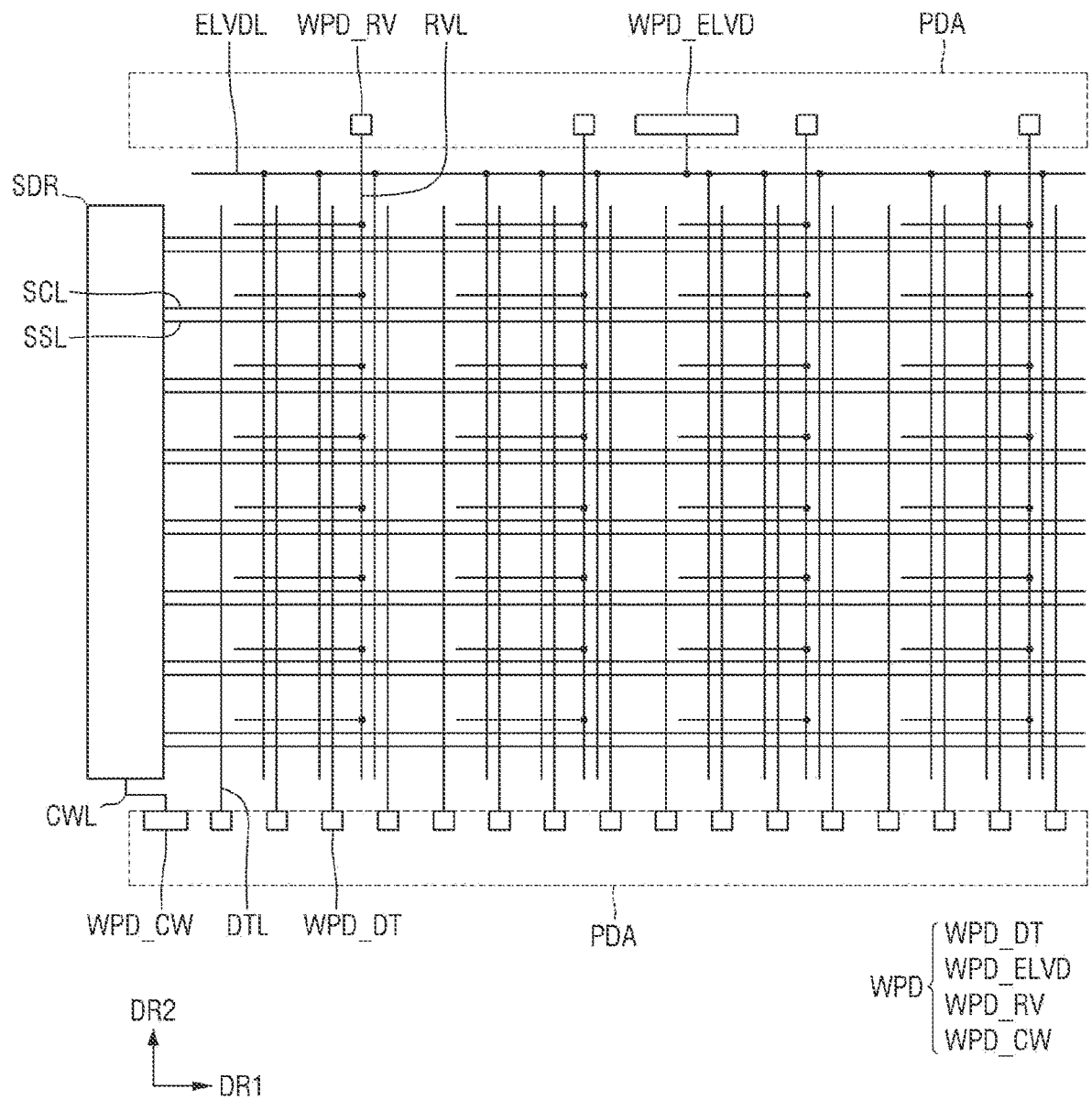
FIG. 2 is a layout view of the circuitry of a first substrate of the display device of FIG. 1.

FIG. 2 is a layout view of the circuitry of a first substrate of the display device of FIG. 1.

Referring to FIG. 2, a plurality of lines are on a first substrate. The plurality of lines may include scan lines SCL, sensing signal lines SSL, data lines DTL, reference voltage lines RVL, and a first power supply line ELVDL.

The scan lines SCL and the sensing signal lines SSL may extend in a first direction DR1. The scan lines SCL and the sensing signal lines SSL may be connected (e.g., electrically coupled) to the scan driver SDR. The scan driver SDR may include driving circuits that include (e.g., consist of) the circuit layer CCL. The scan driver SDR may be in the third non-display area NDA on the first substrate, but the present disclosure is not limited thereto. In one or more embodiments, the scan driver SDR may be in a fourth non-display area NDA adjacent a second short side (e.g., the right side) of the display device 1, or in both the third and fourth non-display areas NDA. The scan driver SDR may be connected (e.g., electrically coupled) to a signal connecting line CWL, and at least one end of the signal connecting line CWL may form a pad WPD_CW in the first non-display area NDA and/or the second non-display area NDA and may be connected (e.g., electrically coupled) to the external devices EXD of FIG. 1.

The data lines DTL and the reference voltage lines RVL may extend in a second direction DR2, which intersects the first direction DR1. The first power supply line ELVDL may include portions that extend in the second direction DR2. The first power supply line ELVDL may further include portions that extend in the first direction DR1. The first power supply line ELVDL may form a mesh structure, but the present disclosure is not limited thereto.

Wire pads WPD may be provided at at least one end of each of the data lines DTL, the reference voltage line RVL and the first power supply line ELVDL. The wire pads WPD may be in a pad portion PDA of the non-display area NDA. Wire pads WPD_DT (hereinafter, the data pads WPD_DT) of the data lines DTL may be in the pad portion PDA of the first non-display area NDA, and wire pads WPD_RV (hereinafter, the reference voltage pads WPD_RV) of the reference voltage lines RVL and a wire pad WPD_ELVD (hereinafter, the first power supply pad WPD_ELVD) of the first power supply line ELVDL may be in the pad portion PDA of the second non-display area NDA. In one or more embodiments, the data pads WPD_DT, the reference voltage pads WPD_RV and the first power supply pad WPD_ELVD may all be in the same area, for example, the first non-display area NDA. The external devices EXD of FIG. 1 may be mounted on the wire pads WPD. The external devices EXD may be mounted on the wire pads WPD via anisotropic conductive films and/or via ultrasonic bonding.

The pixels PX on the first substrate may include pixel driving circuits. The plurality of lines may pass by the pixels PX to apply driving signals to the pixel driving circuits. Each of the pixel driving circuits may include transistors and capacitors. The numbers of transistors and capacitors in each of the pixel driving circuits may vary. It will hereinafter be described that the pixel driving circuits have a "3T1C" structure with three transistors and one capacitor, but the present disclosure is not limited thereto. In one or more embodiments, various modified pixel structures such as a "2T1C", "7T1C", or "6T1C" structure may be applied to the pixel driving circuits.

Figure 3:
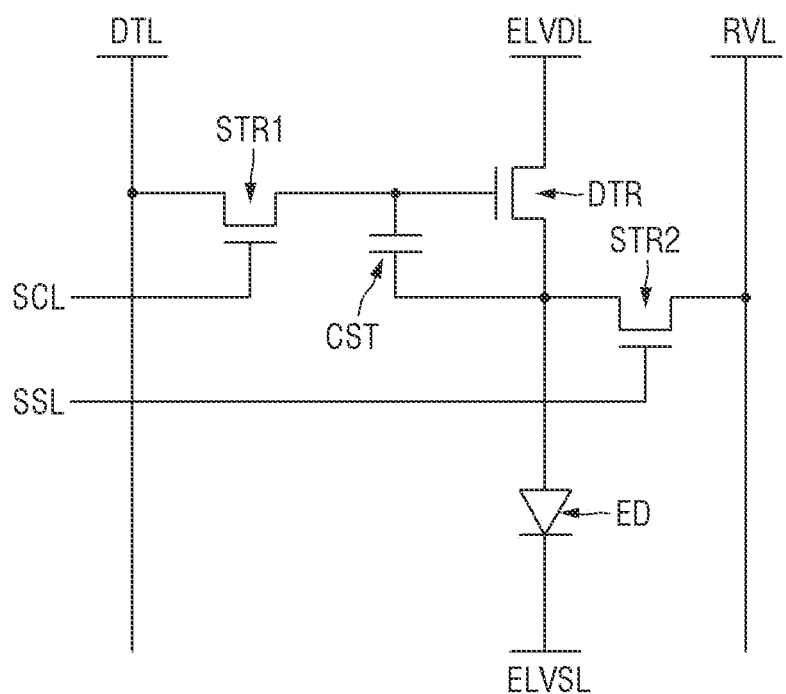
FIG. 3 is an equivalent circuit diagram of a pixel of the display device of FIG. 1.

FIG. 3 is an equivalent circuit diagram of a pixel of the display device of FIG. 1.

Referring to FIG. 3, a pixel PX may include a light-emitting diode ED and may further include three transistors, e.g., a driving transistor DTR, a first switching transistor STR1, and a second switching transistor STR2, and one storage capacitor CST.

The light-emitting diode ED emits light in accordance with a current applied thereto via the driving transistor DTR. The light-emitting diode ED may be implemented as an OLED, a micro-LED, or a nano-LED.

The first electrode (e.g., the anode electrode) of the light-emitting diode ED may be connected (e.g., coupled) to the source electrode of the driving transistor DTR, and the second electrode (e.g., the cathode electrode) of the light-emitting diode ED may be connected (e.g., coupled) to a second power supply line ELVSL, to which a low-potential voltage (or a second power supply voltage) lower than a high-potential voltage (or a first power supply voltage) from the first power supply line ELVDL is applied.

The driving transistor DTR may control a current that flows from the first power supply line ELVDL, to which the first power supply voltage is applied, to the light-emitting diode ED in accordance with the difference in voltage between the gate electrode and the source electrode thereof. The gate electrode of the driving transistor DTR may be connected (e.g., coupled) to the first source/drain electrode of the first switching transistor STR1, the source electrode of the driving transistor DTR may be connected (e.g., coupled) to the first electrode of the light-emitting diode ED, and the drain electrode of the driving transistor DTR may be connected (e.g., coupled) to the first power supply line ELVDL, to which the first power supply voltage is applied.

The first switching transistor STR1 is turned on by a scan signal from a scan line SCL and connects (e.g., couples) a data line DTL to the gate electrode of the driving transistor DTR. The gate electrode of the first switching transistor STR1 may be connected (e.g., coupled) to the scan line SCL, the first source/drain electrode of the first switching transistor STR1 may be connected (e.g., coupled) to the gate electrode of the driving transistor DTR1, and the second source/drain electrode of the first switching transistor STR1 may be connected (e.g., coupled) to the data line DTL.

The second switching transistor STR2 is turned on by a sensing signal from a sensing signal line SSL and connects (e.g., couples) a reference voltage line RVL to the source electrode of the driving transistor DTR. The gate electrode of the second switching transistor STR2 may be connected (e.g., coupled) to the sensing signal line SSL, the first source/drain electrode of the second switching transistor STR2 may be connected (e.g., coupled) to the reference voltage line RVL, and the second source/drain electrode of the second switching transistor STR2 may be connected (e.g., coupled) to the source electrode of the driving transistor DTR.

The first source/drain electrodes of the first and second transistors STR1 and STR2 may both be source electrodes, and the second source/drain electrodes of the first and second transistors STR1 and STR2 may both be drain electrodes. In one or more embodiments, the first source/drain electrodes of the first and second transistors STR1 and STR2 may both be drain electrodes, and the second source/drain electrodes of the first and second transistors STR1 and STR2 may both be source electrodes.

The storage capacitor CST may be formed between the gate electrode and the source electrode of the driving transistor DTR. The storage capacitor CST may store a differential voltage corresponding to the difference between gate and source voltages of the driving transistor DTR.

The driving transistor DTR and the first and second switching transistors STR1 and STR2 may be formed as thin-film transistors (TFTs). FIG. 3 illustrates that the driving transistor DTR and the first and second switching transistors STR1 and STR2 are N-type metal oxide semiconductor field-effect transistors (MOSFETs), but the present disclosure is not limited thereto. In one or more embodiments, the driving transistor DTR and the first and second switching transistors STR1 and STR2 may all be P-type MOSFETs. In one or more embodiments, some of the driving transistor DTR and the first and second switching transistors STR1 and STR2 may be N-type MOSFETs, and other(s) thereof may be a P-type MOSFET.

Figure 4:
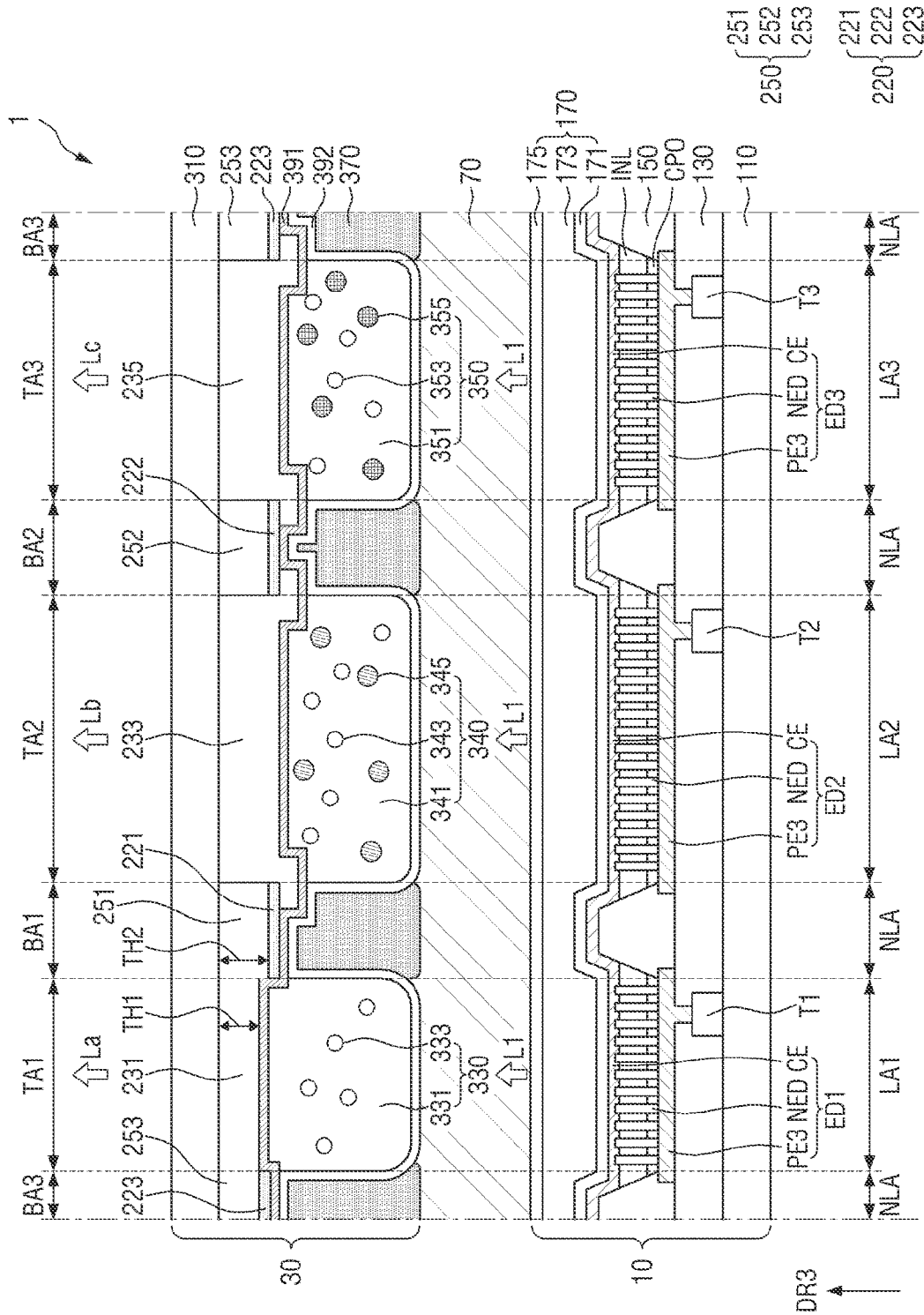
FIG. 4 is a cross-sectional view of the display device of FIG. 1.

FIG. 4 is a cross-sectional view of the display device of FIG. 1.

Referring to FIG. 4, the display device 1 may include a display substrate 10, a color conversion substrate 30, which faces the display substrate 10, and a filler 70, which is between the display substrate 10 and the color conversion substrate 30.

The display substrate 10 may include a first substrate 110. The first substrate 110 may be an insulating substrate. The first substrate 110 may include a transparent material. In one or more example embodiments, the first substrate 110 may include a transparent insulating material such as glass and/or quartz. The first substrate 110 may be a rigid substrate, but the present disclosure is not limited thereto. In one or more embodiments, the first substrate 100 may include plastic such as polyimide and may have flexibility such as bendability, foldability, and/or rollability. A plurality of emission areas (LA1, LA2, and LA3) and a non-emission area NLA may be defined on the first substrate 110.

A plurality of switching elements (T1, T2, and T3) may be on the first substrate 110. In one or more example embodiments, a first switching element T1 may be in a first emission area LA1 of the first substrate 110, a second switching element T2 may be in a second emission area LA2 of the first substrate 110, and a third switching element T3 may be in a third emission area LA3 of the first substrate 110. However, the present disclosure is not limited to this example. In another example, at least one selected from the first, second, and third switching elements T1, T2, and T3 may be in the non-emission area NLA.

In one or more example embodiments, the first, second, and third switching elements T1, T2, and T3 may be thin-film transistors (TFTs) including amorphous silicon, polysilicon, and/or an oxide semiconductor. In one or more embodiments, a plurality of signal lines (e.g., gate lines, data lines, and/or power lines), which transmit signals to the switching elements (T1, T2, and T3), may be further provided on the first substrate 110.

A planarization film 130 may be provided on the first, second, and third switching elements T1, T2, and T3. In one or more example embodiments, the planarization film 130 may be formed as an organic film. The planarization film 130 may include, for example, an acrylic resin, an epoxy resin, an imide resin, and/or an ester resin. In one or more example embodiments, the planarization film 130 may include a positive photosensitive material or a negative photosensitive material.

First, second, and third pixel electrodes PE1, PE2, and PE2 may be on the planarization film 130. The first, second, and third pixel electrodes PE1, PE2, and PE3 may function as first electrodes of first, second, and third LEDs "ED1", "ED2", and "ED3", respectively, and may be anodes or cathodes. The first pixel electrode PE1 may be in the first emission area LA1 and may extend, at least in part, even into the non-emission area NLA. The second pixel electrode PE2 may be in the second emission area LA2 and may extend, at least in part, even into the non-emission area NLA. The third pixel electrode PE3 may be in the third emission area LA3 and may extend, at least in part, even into the non-emission area NLA. The first pixel electrode PE1 may be connected (e.g., coupled) to the first switching element T1 through the planarization film 130, the second pixel electrode PE2 may be connected (e.g., coupled) to the second switching element T2 through the planarization film 130, and the third pixel electrode PE3 may be connected (e.g., coupled) to the third switching element T3 through the planarization film 130.

The first, second, and third pixel electrodes PE1, PE2, and PE3 may be reflective electrodes. The first, second, and third pixel electrodes PE1, PE2, and PE3 may have a structure in which a high-work function layer of titanium oxide ($TiO_2$), indium tin oxide (ITO), indium zinc oxide (IZO), zinc oxide (ZnO), indium tin zinc oxide (ITZO), and/or magnesium oxide (MgO), and a reflective material layer of silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof are stacked. The high-work function layer may be on the reflective material layer, close to light-emitting elements NED. The first, second, and third pixel electrodes PE1, PE2, and PE3 may each independently have a multilayer structure of ITO/Mg, ITO/MgF, ITO/Al, or ITO/Ag/ITO, but the present disclosure is not limited thereto.

A bank 150 may be on the first, second, and third pixel electrodes PE1, PE2, and PE3. The bank 150 may include openings, which expose the first, second, and third pixel electrodes PE1, PE2, and PE3, and may define the first, second, and third emission areas LA1, LA2, and LA3 and the non-emission area NLA. For example, portion of the first pixel electrode PE1 not covered, but exposed by the bank 150 may be the first emission area LA1, portion of the second pixel electrode PE2 not covered, but exposed by the bank 150 may be the second emission area LA2, and portion of third pixel electrode PE3 not covered, but exposed by the bank 150 may be the third emission area LA3. A region where the bank 150 is positioned may be the non-emission area NLA.

The bank 150 may include an organic insulating material such as an acrylic resin, an epoxy resin, a phenolic resin, a polyamide resin, a polyimide resin, an unsaturated polyester resin, a polyphenylene resin, a polyphenylene sulfide resin, and/or benzocyclobutene (BCB).

In one or more example embodiments, the bank 150 may overlap with color patterns and light-blocking members of the color conversion substrate 30 that will be described hereinbelow. In one or more example embodiments, the bank 150 may overlap with first, second, and third light-blocking members 221, 222, and 223. The bank 150 may also overlap with first, second, and third color patterns 251, 252, and 253. The bank 150 may also overlap with color mixing-preventing members 370 (e.g., color mixing-reducing members 370) that will be described herein.

In one or more example embodiments, the bank 150 may function as a partition wall that prevents or reduce the spilling over of ink including light-emitting elements between each pair of adjacent pixels. The surface of the bank 150 may be hydrophobically treated so that ink may not spread thereon.

Light-emitting elements NED, conductive polymer layers CPO, and insulating layers INL may be on the first, second, and third pixel electrodes PE1, PE2, and PE3. The light-emitting elements NED, the conductive polymer layers CPO, and the insulating layers INL will be described hereinbelow with reference to FIG. 5.

A common electrode CE may be on the light-emitting elements NED. The common electrode CE may function as a second electrode of the first LED "ED1" and may be an anode or a cathode. In one or more example embodiments, the common electrode CE may have translucency or transmissivity. In a case where the common electrode CE has translucency, the common electrode CE may include Ag, Mg, Cu, Al, Pt, Pd, Au, Ni, Nd, Ir, Cr, Li, Ca, LiF/Ca, LiF/Al, Mo, Ti, a compound thereof, or a mixture thereof, for example, the mixture of Ag and Mg. In a case where the common electrode CE is tens to hundreds of angstroms, the common electrode CE may have translucency.

In a case where the common electrode CE has transparency, the common electrode CE may include a transparent conductive oxide (TCO). In one or more example embodiments, the common electrode CE may include $TiO_2$, ITO, IZO, ZnO, ITZO, and/or MgO.

The first pixel electrode PE1, light-emitting elements NED, and the common electrode CE may form the first LED "ED1", the second pixel electrode PE2, light-emitting elements NED, and the common electrode CE may form the second LED "ED2", and the third pixel electrode PE3, light-emitting elements NED, and the common electrode CE may form the third LED "ED3". The first, second, and third LEDs "ED1", "ED2", and "ED3" may emit light, and the light may be provided to the color conversion substrate 30.

A thin-film encapsulation layer 170 may be on the common electrode CE. The thin-film encapsulation layer 170 may be located in common in and throughout the first, second, and third emission areas LA1, LA2, and LA3 and the non-emission area NLA. In one or more example embodiments, the thin-film encapsulation layer 170 may directly cover the common electrode CE. A capping layer, which covers the common electrode CE, may be further provided between the thin-film encapsulation layer 170 and the common electrode CE. In this case, the thin-film encapsulation layer 170 may directly cover the capping layer.

In one or more example embodiments, the thin-film encapsulation layer 170 may include a first encapsulation inorganic film 171, an encapsulation organic film 173, and a second encapsulation inorganic film 175, which are sequentially stacked on the common electrode CE.

The first and second encapsulation inorganic films 171 and 175 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and/or lithium fluoride. The encapsulation organic film 173 may include an acrylic resin, a methacrylic resin, polyisoprene, a vinyl resin, an epoxy resin, a urethane resin, a cellulose resin, and/or a perylene resin. However, the structure of the thin-film encapsulation layer 170 is not particularly limited, but may vary.

The color conversion substrate 30 may be positioned to face the display substrate 10.

The color conversion substrate 30 may include a second substrate 310. The second substrate 310 may be an insulating substrate. The second substrate 310 may include a transparent material. In one or more example embodiments, the second substrate 310 may include a transparent insulating material such as glass and/or quartz. The second substrate 310 may be a rigid substrate, but the present disclosure is not limited thereto. In one or more embodiments, the second substrate 310 may include plastic such as polyimide and may have flexibility such as bendability, foldability, and/or rollability. A plurality of light-transmitting areas (TA1, TA2, and TA3) and a light-blocking area BA may be defined on the first substrate 110.

A first color filter 231 and color patterns 250 may be on a surface of the second substrate 310 that faces the display substrate 10.

The first color filter 231 may selectively transmit second-color light (e.g., red light) therethrough and may absorb third-color light (e.g., green light). In one embodiment, the first color filter 231 may be a blue filter and may include a blue colorant such as a blue dye and/or a blue pigment. The term "colorant", as used herein, may encompass both a dye and a pigment.

The color patterns 250 may reduce the reflection of external light by absorbing some of the light introduced into the color conversion substrate 30 from outside the display device 1. Most of external light is reflected and causes the distortion of the color reproducibility of the color conversion substrate 30. However, as the color patterns 250 are provided on the second substrate 310, the reflection of external light and the distortion of colors by external light can be reduced.

In one or more example embodiments, the color patterns 250 may include a blue colorant such as a blue dye and/or a blue pigment. The color patterns 250 may be formed of the same material as the first color filter 231, and may be formed during the formation of the first color filter 231. For example, the first color filter 231 and the color patterns 250 may be formed at the same time (or concurrently) by applying a photosensitive organic material including a blue colorant on the surface of the second substrate 310 and subjecting the photosensitive organic material to light exposure and development.

In a case where the color patterns 250 include a blue colorant, external light or reflected light passing through the color patterns 250 may have a blue wavelength range. The color sensitivity of the human eye may vary from one color to another color. For example, blue-wavelength light may be recognized less sensitively than green- and red-wavelength light by a user. Thus, as the color patterns 250 include a blue colorant, the user can recognize reflected light less sensitively.

The color patterns 250 may be on the surface of the second substrate 310 to overlap with the light-blocking area BA. The color patterns 250 may also overlap with the non-emission area NLA. In one or more example embodiments, the color patterns 250 may be in contact with the surface of the second substrate 310. In another example, in embodiment(s) where a buffer layer is provided on the surface of the second substrate 310 to prevent or reduce the infiltration of impurities, the color patterns 250 may be in direct contact (e.g., physical contact) with the buffer layer.

Light-blocking members 220 may be on the surface of the second substrate 310 that faces the display substrate 10. The light-blocking members 220 may overlap with the light-blocking area BA to block or reduce the transmission of light. The light-blocking members 220 may be arranged in a lattice form in a plan view.

In one or more example embodiments, the light-blocking members 220 may include an organic light-blocking material and may be formed by coating and exposing (e.g., exposing to light) the organic light-blocking material. The light-blocking members 220 may include a light-blocking dye and/or pigment and may be a black matrix.

As mentioned above, external light may distort the color reproducibility of the color conversion substrate 30. However, as the light-blocking members 220 are on the second substrate 310, at least some of external light can be absorbed by the light-blocking members 220. Thus, the distortion of colors by external light can be reduced. The light-blocking members 220 can prevent or reduce the infiltration of light between each pair of adjacent light-transmitting areas and can thus prevent or reduce the mixture (e.g., undesirable mixture) of colors. Therefore, the color reproducibility of the display device 1 can be improved.

The light-blocking members 220 may be on the color patterns 250. In one or more example embodiments, first, second, and third light-blocking members 221, 222, and 223 may be on first, second, and third color patterns 251, 252, and 253.

As illustrated in FIG. 4, second and third color filters 233 and 235 may be on the surface of the second substrate 310 that faces the display substrate 10.

The second and third color filters 233 and 235 may overlap with second and third light-transmitting areas TA2 and TA3, respectively. In one or more example embodiments, one side of the second color filter 233 may overlap with the first light-blocking area BA1 and may be on the first color pattern 251 and the first light-blocking member 221, and the other side of the second color filter 233 may overlap with the second light-blocking area BA2 and may be on the second color pattern 252 and the second light-blocking member 222.

In one or more example embodiments, one side of the third color filter 235 may overlap with the second light-blocking area BA2 and may be on the second color pattern 252 and the second light-blocking member 222, and the other side of the third color filter 235 may overlap with the third light-blocking area BA3 and may be on the third color pattern 253 and the third light-blocking member 223.

The second color filter 233 may block or absorb (e.g., reduce) first-color light (e.g., blue light). For example, the second color filter 233 may function as a blue filter capable of blocking or reducing blue light. The second color filter 233 may selectively transmit second-color light (e.g., red light) therethrough and may block or absorb (e.g., reduce transmission of) first-color light and third-color light (e.g., green light). In one or more example embodiments, the second color filter 233 may be a red filter and may include a red colorant such as a red dye and/or a red pigment.

The third color filter 235 may block or absorb (e.g., reduce transmission of) first-color light. For example, the third color filter 235 may also function as a blue filter capable of blocking or reducing blue light. The third color filter 235 may selectively transmit third-color light therethrough and may block or absorb (e.g. reduce transmission of) first-color light and second-color light. In one or more example embodiments, the third color filter 235 may be a green filter and may include a green colorant such as a green dye and/or a green pigment.

As illustrated in FIG. 4, a first capping layer 391, which covers the light-blocking members 220, the color patterns 250, and the first, second, and third color filters 231, 233, and 235, may be on the surface of the second substrate 310. The first capping layer 391 may prevent or reduce the damage to the first, second, and third color filters 231, 233, and 235 or their pollution by impurities from the outside such as moisture and/or the air. In one or more embodiments, the first capping layer 391 may prevent or reduce the diffusion of the colorants of the first, second, and third color filters 231, 233, and 235 into other elements. The first capping layer 391 may be in direct contact (e.g., physical contact) with surfaces (e.g., bottom surfaces) of the first, second, and third color filters 231, 233, and 235.

The first capping layer 391 may be formed of an inorganic material. In one or more example embodiments, the first capping layer 391 may include silicon nitride, aluminum nitride, zirconium nitride, titanium nitride, hafnium nitride, tantalum nitride, silicon oxide, aluminum oxide, titanium oxide, tin oxide, and/or silicon oxynitride.

A light-transmitting pattern 330 may be on the first capping layer 391. In one or more example embodiments, the light-transmitting pattern 330 may be formed by applying a photosensitive material and subjecting the photosensitive material to light exposure and development, but the present disclosure is not limited thereto. In another example, the light-transmitting pattern 330, a first wavelength conversion pattern 340, and a second wavelength conversion pattern 350 may be formed by inkjet printing.

The light-transmitting pattern 330 may be on the first capping layer 391 and may overlap with the first light-transmitting area TA1. The light-transmitting pattern 330 may transmit incident light therethrough. Emitted light L1 from the first LED "ED1" may be blue light. The emitted light L1 may be emitted out of the display device 1 through the light-transmitting pattern 330 and the first color filter 231. For example, first light La emitted from the first light-transmitting area TA1 may be blue light.

In one or more example embodiments, the light-transmitting pattern 330 may include a first base resin 331 and may further include a first scatterer 333, which is dispersed in the first base resin 331.

The first base resin 331 may be formed of a material with high light transmittance. In one or more example embodiments, the first base resin 331 may be formed of an organic material. The first base resin 331 may include an organic material such as, for example, an epoxy resin, an acrylic resin, a cardo resin, and/or an imide resin.

The first scatterer 333 may have a different refractive index from the first base resin 331 and may form an optical interface with the first base resin 331. In one or more example embodiments, the first scatterer 333 may be light-scattering particles. The material of the first scatterer 333 is not particularly limited as long as it can suitably scatter at least some of the emitted light L1. The first scatterer 333 may be, for example, particles of a metal oxide and/or particles of an organic material. The metal oxide may be, for example, $TiO_2$, zirconium oxide ($ZrO_2$), aluminum oxide ($Al_2O_3$), indium oxide ($In_2O_3$), ZnO, and/or tin oxide ($SnO_2$), and the organic material may be, for example, an acrylic resin and/or a urethane resin. The first scatterer 333 may scatter incident light in random (various) directions, regardless of the incidence direction of the incident light, without substantially changing the wavelength of the incident light passing through the light-transmitting pattern 330.

The first and second wavelength conversion patterns 340 and 350 may be on the first capping layer 391.

The first wavelength conversion layer 340 may be on the first capping layer 391 and may overlap with the second light-transmitting area TA2. The first wavelength conversion pattern 340 may convert or shift the peak wavelength of incident light into a set or particular peak wavelength. In one or more example embodiments, the first wavelength conversion pattern 340 may convert emitted light L1 from the second LED "ED2" into red light having a peak wavelength of about 610 nm to about 650 nm and may emit the red light. For example, second light Lb emitted from the second light-transmitting area TA2 may be red light.

The first wavelength conversion pattern 340 may include a second base resin 341 and a first wavelength shifter 345, which is dispersed in the second base resin 341, and may further include a second scatterer 343, which is also dispersed in the second base resin 341.

The second base resin 341 may be formed of a material having high light transmittance. In one or more example embodiments, the second base resin 341 may be formed of an organic material. The second base resin 341 may be formed of the same material as the first base resin 331 or may include at least one of the above-described materials that may be included in the first base resin 331, but the present disclosure is not limited thereto.

The first wavelength shifter 345 may convert or shift the peak wavelength of incident light into a set or particular peak wavelength. In one or more example embodiments, the first wavelength shifter 345 may convert first-color light from the second LED "ED2", e.g., blue light, into red light having a single peak wavelength of about 610 nm to about 650 nm and may emit the red light.

Examples of the first wavelength shifter 345 include quantum dots, quantum rods, and a phosphor. In one or more example embodiments, the quantum dots may be a particulate material that emits light of a particular color in response to the electrons transitioning from the conduction band to the valance band.

The quantum dots may be a semiconductor nanocrystal material. Because the quantum dots have a set or predetermined band gap depending on their composition and size, the quantum dots absorb light and emit light of a set or predetermined wavelength. The semiconductor nanocrystal material may include a group IV element, a group II-VI compound, a group III-V compound, a group IV-VI compound, or any combination thereof.

The group II-VI compound may be selected from the group consisting of: a binary compound selected from among CdSe, CdTe, ZnS, ZnSe, ZnTe, ZnO, HgS, HgSe, HgTe, MgSe, MgS, and a mixture thereof; a ternary compound selected from among InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from among GaN, GaP, GaAs, GaSb, AlN, AlP, AlAs, AlSb, InN, InP, InAs, InSb, and a mixture thereof; a ternary compound selected from among GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from among SnS, SnSe, SnTe, PbS, PbSe, PbTe, and a mixture thereof; a ternary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from the group consisting of Si, Ge, and a mixture thereof. The group IV compound may be a binary compound selected from among SiC, SiGe, and a mixture thereof.

These binary, ternary, and/or quaternary compounds may exist in a uniform concentration or in a partially different concentration in particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots.

In one or more example embodiments, the quantum dots may have a core-shell structure including (e.g., consisting of) a core including the above-described semiconductor nanocrystal material and a shell surrounding (e.g., around) the core. The shells of the quantum dots may serve as protective layers for maintaining the semiconductor characteristics of the quantum dots by preventing or reducing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the respective quantum dots may have a concentration gradient in which the concentration of the element(s) at the shells of the quantum dots gradually decreases toward the centers of the shells of the respective quantum dots. The shells of the quantum dots may include a metal oxide, a non-metal oxide, a semiconductor compound, or a combination thereof.

In one or more example embodiments, the metal oxide and the non-metal oxide may each independently be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a ternary compound such as $MgAl_2O_4$, $CoFe_2O_4$, $NiFe_2O_4$, and/or $CoMn_2O_4$, but the present disclosure is not limited thereto.

In one or more example embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb, but the present disclosure is not limited thereto.

Light emitted by the first wavelength shifter 345 may have a full width at half maximum (FMHM) of about 45 nm or less, about 40 nm or less, or about 30 nm or less, and thus, the purity of colors displayed by the display device 1 and the color reproducibility of the display device 1 can be further improved. Also, the first wavelength shifter 345 can emit light in various directions regardless of the incidence direction of the light. The side visibility of the second color displayed in the second light-transmitting area TA2 can be improved.

Some of emitted light from the second LED "ED2" may be emitted through the first wavelength conversion pattern 340 without being converted into red light by the first wavelength shifter 345. Blue light passing through the first wavelength conversion pattern 340, among beams of the emitted light from the second LED "ED2", may be blocked by the second color filter 233. Red light obtained by the first wavelength conversion pattern 340 from the emitted light from the second LED "ED2" may be emitted out of the display device 1 through the second color filter 233. For example, second light emitted from the second light-transmitting area TA2 may be red light.

The second scatterer 343 may have a different refractive index from the second base resin 341 and may form an optical interface with the second base resin 341. In one or more example embodiments, the second scatterer 343 may include light-scattering particles. The second scatterer 343 is substantially the same as, or similar to, the first scatterer 333, and thus, a detailed description thereof will be omitted.

The second wavelength conversion pattern 350 may be on the first capping layer 391 and may overlap with the third light-transmitting area TA3. The second wavelength conversion pattern 350 may convert or shift the peak wavelength of incident light into a particular peak wavelength. In one or more example embodiments, the second wavelength conversion pattern 350 may convert emitted light L1 from the third LED "ED3" into green light having a peak wavelength of about 510 nm to about 550 nm and may emit the green light. For example, third light Lc emitted from the third light-transmitting area TA3 may be green light.

The second wavelength conversion pattern 350 may include a third base resin 351 and a second wavelength shifter 355, which is dispersed in the third base resin 351, and may further include a third scatterer 353 which is also dispersed in the third base resin 351.

The third base resin 351 may be formed of a material with high light transmittance. In one or more example embodiments, the third base resin 351 may be formed of an organic material. The third base resin 351 may be formed of the same material as the first base resin 331 or may include at least one of the above-described materials that may be included in the first base resin 331, but the present disclosure is not limited thereto.

The second wavelength shifter 355 may convert or shift the peak wavelength of incident light into a set or particular peak wavelength. In one or more example embodiments, the second wavelength shifter 355 may convert blue light having a peak wavelength of about 440 nm to about 480 nm into green light having a peak wavelength of about 510 nm to about 550 nm.

Examples of the second wavelength shifter 355 include quantum dots, quantum rods, and a phosphor. The second wavelength shifter 355 is substantially the same as, or similar to the first wavelength shifter 345, and thus, a detailed description thereof will be omitted.

The third scatterer 353 may have a different refractive index from the third base resin 351 and may form an optical interface with the third base resin 351. In one or more example embodiments, the third scatterer 353 may include light-scattering particles. The third scatterer 353 is substantially the same as, or similar to, the first scatterer 333, and thus, a detailed description thereof will be omitted.

Emitted light from the third LED "ED3" may be provided to the second wavelength conversion pattern 350, and the second wavelength shifter 355 may convert the emitted light from the third LED "ED3" into green light having a peak wavelength of about 510 nm to about 550 nm and may emit the green light.

Some of the emitted light from the third LED "ED3" may be emitted through the second wavelength conversion pattern 350 without being converted into red light by the second wavelength shifter 355. The light passing through the second wavelength conversion pattern 350 may be blocked by the third color filter 235. Green light obtained by the second wavelength conversion pattern 350 from the emitted light from the third LED "ED3" may be emitted out of the display device 1 through the third color filter 235. For example, third light emitted from the third light-transmitting area TA3 may be green light.

If emitted light is a mixture of dark blue light and light blue light and has both long-wavelength components and short-wavelength components, the moving path of the emitted light incident upon the second wavelength conversion pattern 350 may be lengthened. Thus, the amount of emitted light provided to the second wavelength shifter 355 and the light conversion efficiency of the second wavelength conversion pattern 350 can be increased. Accordingly, the color reproducibility of the display device 1 can be further improved.

As illustrated in FIG. 4, a second capping layer 392 may be on the light-transmitting pattern 330, the first wavelength conversion pattern 340, and the second wavelength conversion pattern 350. The second capping layer 392 may cover the light-transmitting pattern 330, the first wavelength conversion pattern 340, and the second wavelength conversion pattern 350. The second capping layer 392 may be in contact with the first capping layer 391 and may seal the light-transmitting pattern 330, the first wavelength conversion pattern 340, and the second wavelength conversion pattern 350. Accordingly, damage to the light-transmitting pattern 330, the first wavelength conversion pattern 340, and the second wavelength conversion pattern 350 can be prevented or reduced, as well as their pollution by impurities from the outside such as moisture and/or the air.

The second capping layer 392 may be formed of an inorganic material. In one or more example embodiments, the first capping layer 391 may include silicon nitride, aluminum nitride, zirconium nitride, titanium nitride, hafnium nitride, tantalum nitride, silicon oxide, aluminum oxide, titanium oxide, tin oxide, and/or silicon oxynitride.

In a case where the first and second capping layers 391 and 392 are both formed of an inorganic material, inorganic-inorganic bonds may be formed in regions where the first and second capping layers 391 and 392 are in direct contact (e.g., physical contact) with each other, and as a result, the infiltration of moisture and/or the air from the outside can be effectively prevented or reduced.

As illustrated in FIG. 4, the color mixing-preventing members 370 (e.g., the color mixing-reducing members 370) may be on the second capping layer 392. The color mixing-preventing members 370 (e.g., the color mixing-reducing members 370) may be in the light-blocking area BA to block or reduce the transmission of light. For example, the color mixing-preventing members 370 (e.g., the color mixing-reducing members 370) may be between the light-transmitting pattern 330 and the first wavelength conversion pattern 340 and between the first wavelength conversion pattern 340 and the second wavelength conversion pattern 350 to prevent or reduce color mixing (e.g., undesirable color mixing) between each pair of adjacent light-transmitting areas.

The color mixing-preventing members 370 (e.g., the color mixing-reducing members 370) may include an organic light-blocking material and may be formed by coating the organic light-blocking material and subjecting the organic light-blocking material to exposure (e.g., light exposure). In one or more example embodiments, the color mixing-preventing members 370 (e.g., the color mixing-reducing members 370) may include a light-blocking pigment and/or dye and may be a black matrix.

The filler 70 may be in the space between the color conversion substrate 30 and the display substrate 10. As illustrated in FIG. 4, the filler 70 may be between the second capping layer 392 and the thin-film encapsulation layer 170 and between the color mixing-preventing members 370 (e.g., the color mixing-reducing members 370) and the thin-film encapsulation layer 170. The filler 70 may be in direct contact (e.g., physical contact) with the second capping layer 392 and the color mixing-preventing members 370 (e.g., the color mixing-reducing members 370).

Figure 5:
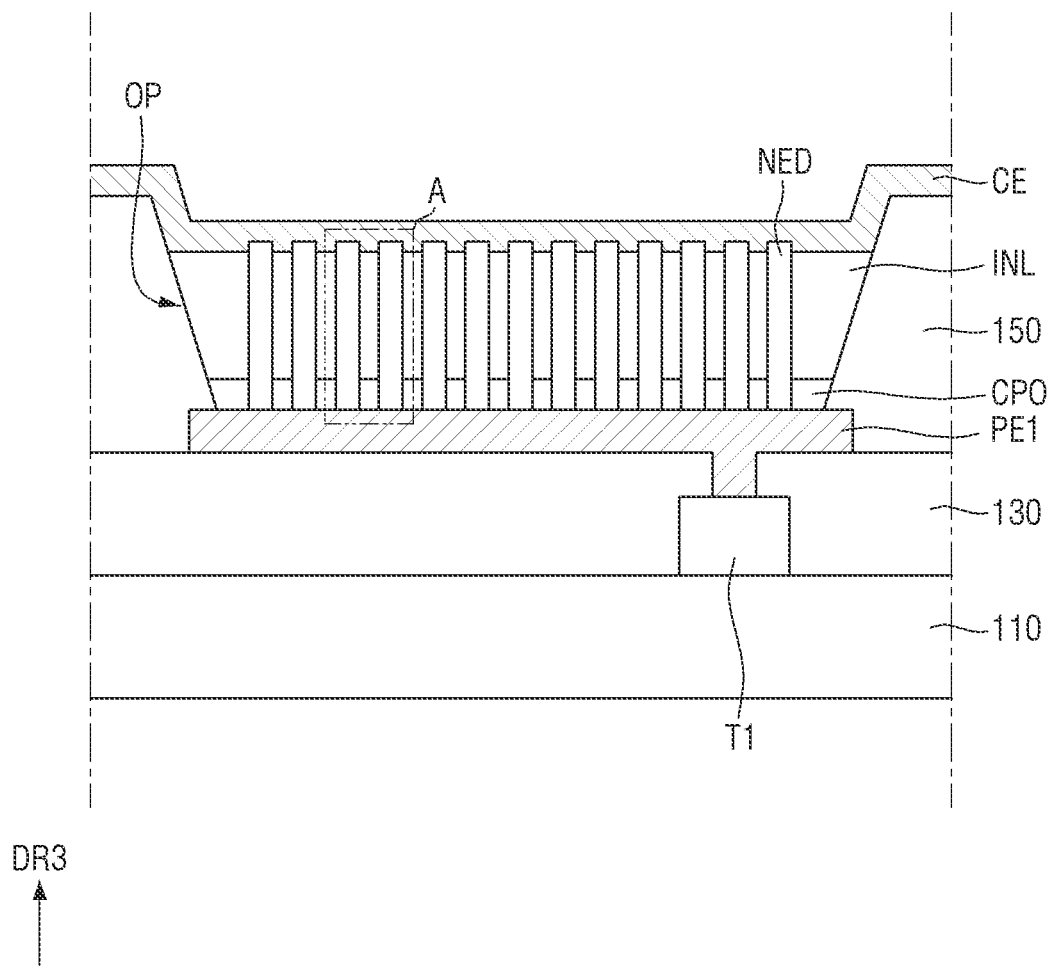
FIG. 5 is a cross-sectional view of a pixel of the display device of FIG. 1.
Figure 6:
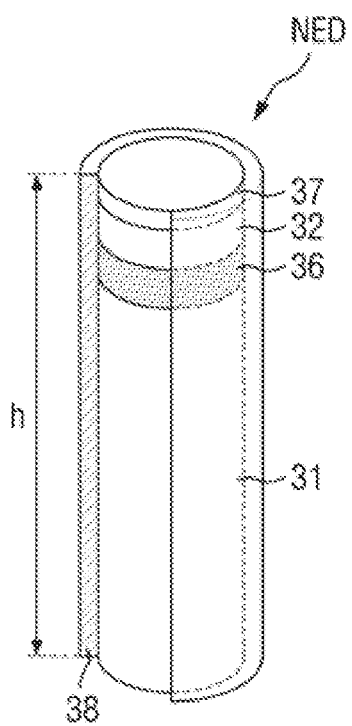
FIG. 6 is a perspective view of a light-emitting element according to one or more embodiments of the present disclosure.
Figure 7:
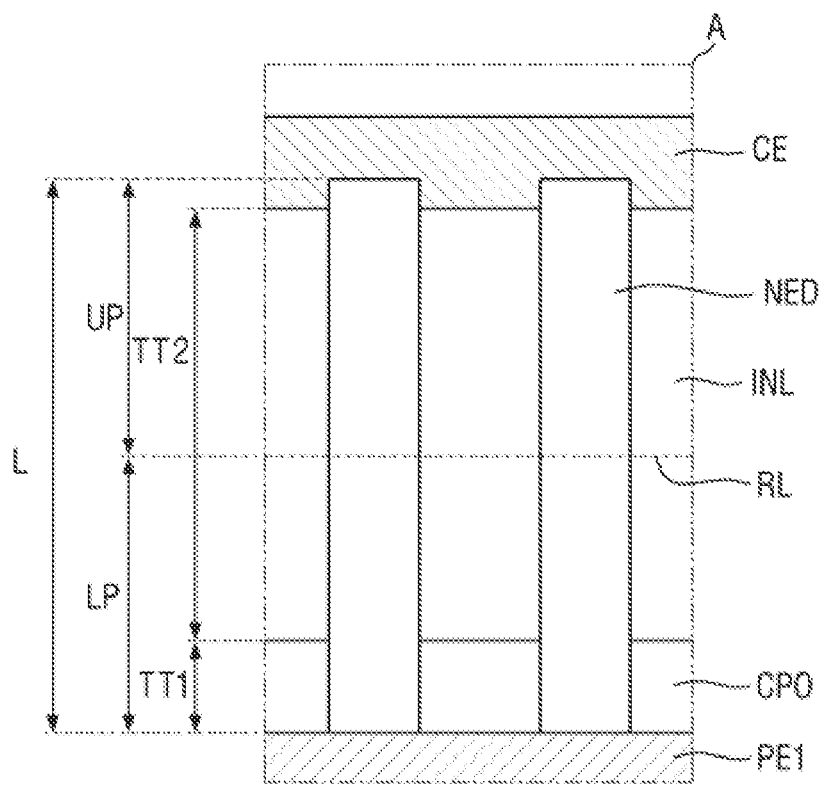
FIG. 7 is an enlarged cross-sectional view of an area A of FIG. 5.
Figure 8:
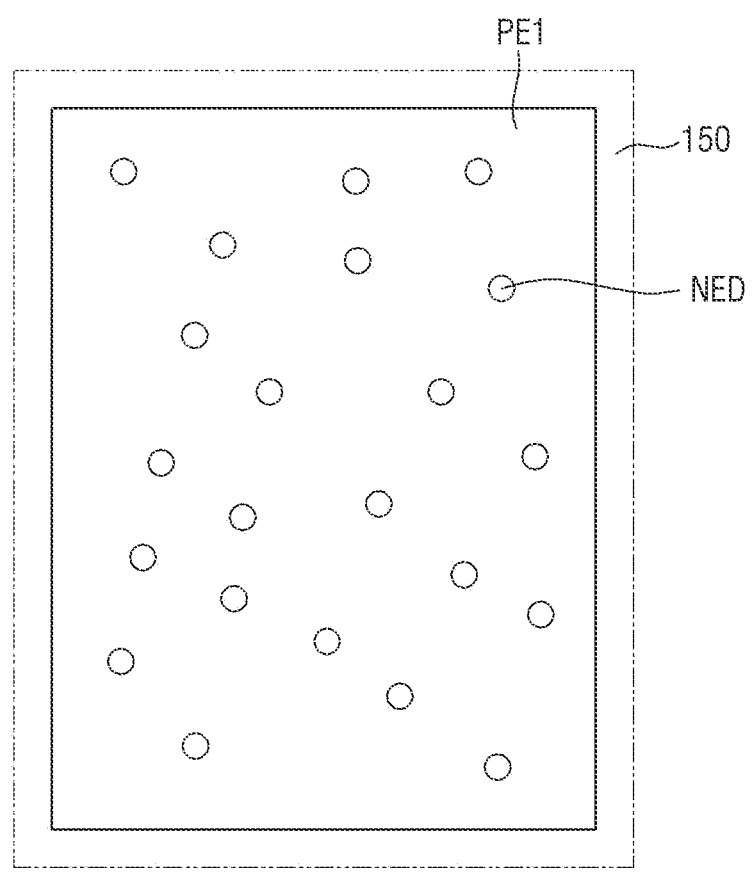
FIG. 8 is a plan view of the pixel of FIG. 5.
Figure 9:
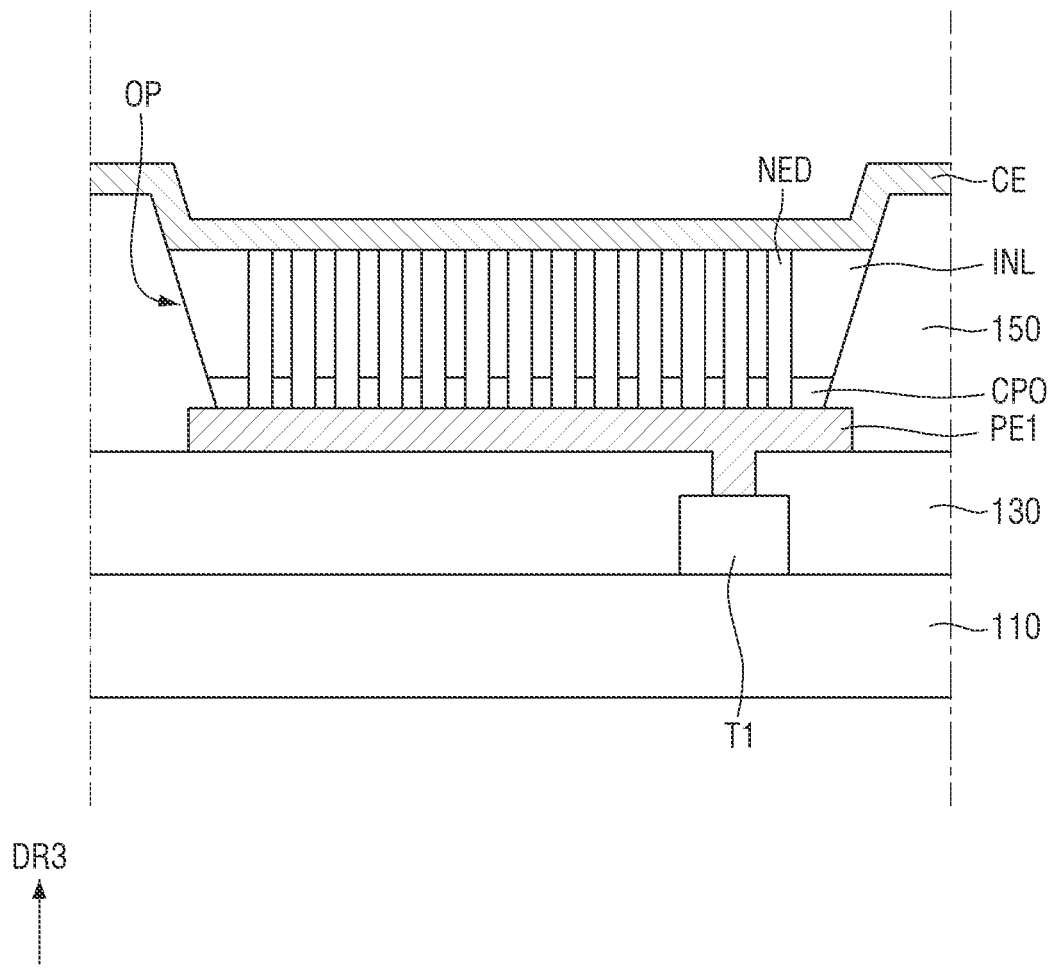
FIG. 9 is a cross-sectional view of another pixel of the display device of FIG. 1.

FIG. 5 is a cross-sectional view of a pixel of the display device of FIG. 1. FIG. 6 is a perspective view of a light-emitting element according to one or more embodiments of the present disclosure. FIG. 7 is an enlarged cross-sectional view of an area A of FIG. 5. FIG. 8 is a plan view of the pixel of FIG. 5. FIG. 9 is a cross-sectional view of another pixel of the display device of FIG. 1.

Referring to FIG. 5, the display device 1 may include a plurality of light-emitting elements NED, which are between a first pixel electrode PE1 and a common electrode CE. The light-emitting elements NED may be positioned in a third direction DR3 to be spaced apart from one another and may be aligned substantially in parallel to one another. The light-emitting elements NED may extend in one direction, and the direction in which the light-emitting elements NED extend may cross (e.g., may be substantially perpendicular to) the top surface of the first pixel electrode PE1. However, the present disclosure is not limited to this. In one or more embodiments, the light-emitting elements NED may be positioned diagonally with respect to the top surface of the first pixel electrode PE1.

Each of the light-emitting elements NED may include semiconductor layers that are doped with dopants of different conductivity types. Each of the light-emitting elements NED may include a plurality of semiconductor layers and may be aligned on the first pixel electrode PE1 so that one end portion thereof may be oriented in a set or particular direction. Each of the light-emitting elements NED may include a light-emitting layer and may thus emit light of a set or particular wavelength range. The light-emitting elements NED may emit light of different wavelength ranges depending on the material of the light-emitting layers thereof, but the present disclosure is not limited thereto. In one or more embodiments, the light-emitting elements NED may emit light of the same color.

The light-emitting elements NED may be on the first pixel electrode PE1, in a space defined by the bank 150. In one or more example embodiments, first end portions of the light-emitting elements NED may face the first pixel electrode PE1, and second end portions of the light-emitting elements NED may face the common electrode CE. The length of the light-emitting elements NED may be smaller than the thickness of the bank 150.

In each of the light-emitting elements NED, a plurality of layers may be arranged in a direction crossing (e.g., perpendicular to) the top surface of the first pixel electrode PE1. The light-emitting elements NED may be positioned so that the direction in which the light-emitting elements NED may cross (e.g., may be perpendicular to) the top surface of the first pixel electrode PE1, and the semiconductor layers included in each of the light-emitting elements NED may be sequentially arranged in the third direction DR3, which is crossing (e.g., perpendicular to) the top surface of the first pixel electrode PE1. However, the present disclosure is not limited to this. In one or more embodiments, the semiconductor layers included in each of the light-emitting elements NED may be arranged in a direction that is substantially parallel to the top surface of the first pixel electrode PE1.

Both end portions of each of the light-emitting elements NED may be in contact with the first pixel electrode PE1 or the common electrode CE. As portion of a semiconductor layer or an electrode layer is exposed on either end surface, in a length direction, of each of the light-emitting elements NED, the exposed portion of the semiconductor layer or the electrode layer may be in contact (e.g., in physical contact) with the first pixel electrode PE1 or the common electrode CE, but the present disclosure is not limited thereto.

Referring to FIG. 6, a light-emitting element NED may be an LED, for example, an inorganic LED having a size of several micrometers or nanometers.

The light-emitting element NED may have a shape that extends in one direction. The light-emitting element NED may have the shape of a cylinder, a rod, a wire, and/or a tube, but the shape of the light-emitting element NED is not particularly limited. In one or more embodiments, the light-emitting element NED may have the shape of a polygonal column such as a regular cube, a rectangular parallelepiped, or a hexagonal column or may have a shape that extends in one direction but with a partially inclined outer surface. A plurality of semiconductors included in the light-emitting element NED may be sequentially stacked in the direction in which the light-emitting element NED extends.

The light-emitting element NED may include semiconductor layers doped with impurities of a set conductivity type (e.g., a p type or an n type). The semiconductor layers may receive electrical signals from an external power source to emit light of a particular wavelength range.

Referring to FIG. 6, the light-emitting element NED may include a first semiconductor layer 31, a second semiconductor layer 32, a light-emitting layer 36, an electrode layer 37, and an insulating film 38.

The first semiconductor layer 31 may include an n-type semiconductor. In embodiment(s) where the light-emitting element NED emits light of a blue wavelength range, the first semiconductor layer 31 may include a semiconductor material, for example, $Al_xGa_yIn_{1-x-y}N$ (where $0 \leq x \leq 1$, $0 \leq y \leq 1$, and $0 \leq x+y \leq 1$), and $Al_xGa_yIn_{1-x-y}N$ may be, for example, at least one selected from AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of about 1.5 μm to about 5 μm, but the present disclosure is not limited thereto.

The second semiconductor layer 32 is on the light-emitting layer 36. The second semiconductor layer 32 may include a p-type semiconductor. In embodiment(s) where the light-emitting element NED emits light of a blue or green wavelength range, the second semiconductor layer 32 may include a semiconductor material, for example, $Al_xGa_yIn_{1-x-y}N$ (where $0 \leq x \leq 1$, $0 \leq y \leq 1$, and $0 \leq x+y \leq 1$), and $Al_xGa_yIn_{1-x-y}N$ may be, for example, at least one selected from AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of about 0.05 µm to about 0.10 µm, but the present disclosure is not limited thereto.

FIG. 6 illustrates that the first and second semiconductor layers 31 and 32 are formed as single layers, but the present disclosure is not limited thereto. In one or more embodiments, each of the first and second semiconductor layers 31 and 32 may include more than one layer. In one or more example embodiments, each of the first and second semiconductor layers 31 and 32 may further include, for example, a clad layer and/or a tensile strain barrier reducing (TSBR) layer, depending on the material of the light-emitting layer 36.

The light-emitting layer 36 is between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN and/or AlGaInN. For example, in embodiment(s) where the light-emitting layer 36 has a multi-quantum well structure in which multiple quantum layers and multiple well layers are alternately stacked, the quantum layers may include a material such as AlGaN and/or AlGaInN, and the well layers may include a material such as GaN and/or AlInN. For example, in embodiment(s) where the light-emitting layer 36 includes AlGaInN as its quantum layer(s) and AlInN as its well layer(s), the light-emitting layer 36 can emit blue light having a central wavelength range of about 450 nm to about 495 nm.

However, the present disclosure is not limited to this. In one or more embodiments, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type (e.g., color) of light emitted by the light-emitting layer 36 is not particularly limited. The light-emitting layer 36 may emit light of a red or green wavelength range as necessary (or desired), instead of blue light. The light-emitting layer 36 may have a length of about 0.05 µm to about 0.10 µm, but the present disclosure is not limited thereto.

Light may be emitted not only from the circumferential surface, in a length direction, of the light-emitting element NED, but also from both sides, in the length direction, of the light-emitting element NED. The directionality of the light emitted from the light-emitting layer 36 is not particularly limited.

The electrode layer 37 may be an ohmic contact electrode, but the present disclosure is not limited thereto. In one or more embodiments, the electrode layer 37 may be a Schottky contact electrode. The light-emitting element NED may include at least one electrode layer 37. FIG. 6 illustrates that the light-emitting element NED includes one electrode layer 37, but the present disclosure is not limited thereto. In one or more embodiments, the light-emitting element NED may include more than one electrode layer 37, or the electrode layer 37 may not be provided. Also, FIG. 6 illustrates that the electrode layer 37 is on one side of the second semiconductor layer 32, but the present disclosure is not limited thereto. In one or more embodiments, the electrode layer 37 may be on one side of the first semiconductor layer 31 or on both one side of the first semiconductor layer and one side of the second semiconductor layer 32.

The electrode layer 37 may reduce the resistance between the light-emitting element NED and electrodes (or contact electrodes) when the light-emitting element NED is electrically connected (e.g., electrically coupled) to the electrodes (or the contact electrodes). The electrode layer 37 may include a conductive metal. For example, the electrode layer 37 may include at least one selected from Al, Ti, In, Au, Ag, ITO, IZO, and ITZO. In one or more embodiments, the electrode layer 37 may include a semiconductor material doped with an n- or p-type dopant. The electrode layer 37 may include the same material or different materials, but the present disclosure is not limited thereto.

The insulating film 38 may surround the first and second semiconductor layers 31 and 32 and the electrode layer 37. For example, the insulating film 38 may surround at least the light-emitting layer 36 and may extend in the direction in which the light-emitting element NED extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element NED.

FIG. 6 illustrates that the insulating film 38 is formed to extend in the length direction of the light-emitting element NED and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32 or may cover only portion of the side of the electrode layer 37 so that the side of the electrode layer 37 may be partially exposed. The insulating film 38 may be formed to be rounded in a cross-sectional view (e.g., may have a circular cross-section), in a region adjacent to at least one end of the light-emitting element NED.

The insulating film 38 may have a thickness of about 10 nm to about 1.0 µm, but the present disclosure is not limited thereto. In one or more embodiments, the insulating film 38 may have a thickness of about 40 nm.

The insulating film 38 may include a material with insulating properties such as, for example, $SiO_x$, $SiN_x$, $SiO_xN_y$, AlN, and/or $Al_2O_3$. Accordingly, the insulating film 38 can prevent or reduce the risk of any short circuit that may occur when the light-emitting layer 36 is placed in direct contact (e.g., physical contact) with electrodes that transmit electrical signals directly to the light-emitting element NED. Also, because the insulating film 38 includes (e.g., surrounds) the light-emitting layer 36 to protect the outer surface of the light-emitting element NED, any degradation in the emission efficiency of the light-emitting element NED can be prevented or reduced.

The outer surface of the insulating film 38 may be subjected to surface treatment. The light-emitting element NED may be sprayed on electrodes in a state of being dispersed in a set or predetermined ink. Here, the surface of the insulating film 38 may be hydrophobically or hydrophilically treated to keep the light-emitting element NED dispersed in ink without agglomerating with other neighboring light-emitting elements 30. For example, the insulating film 38 may be surface-treated with a material such as stearic acid and/or 2,3-naphthalene dicarboxylic acid.

Referring again to FIG. 5, a conductive polymer layer CPO may be on the first pixel electrode PE1. The conductive polymer layer CPO may be in an opening OP, which exposes portion of the first pixel electrode PE1. For example, the conductive polymer layer CPO may be on the first pixel electrode PE1, in the opening OP.

The conductive polymer layer CPO may cover at least one end portion of each of the light-emitting elements NED on the first pixel electrode PE1. The conductive polymer layer CPO may fill the opening OP of the bank 150 to cover at least one end portion of each of the light-emitting elements NED. The conductive polymer layer CPO may improve the contact between the first pixel electrode PE1 and the light-emitting elements NED. As the first pixel electrode PE1 and the light-emitting elements NED are formed of an inorganic material, the conductive polymer layer CPO on the first pixel electrode PE1 and the light-emitting elements NED to improve the electrical contact between the first pixel electrode PE1 and the light-emitting elements NED.

The conductive polymer layer CPO may be formed of a transparent polymer material having conductivity and capable of transmitting light therethrough. In one or more example embodiments, a conductive polymer material having similar electrical properties to the first pixel electrode PE1 may be used to form the conductive polymer layer CPO. In one or more example embodiments, PEDOT:PSS may be used to form the conductive polymer layer CPO to reduce the electrical heterogeneity with the first pixel electrode PE1, but the present disclosure is not limited thereto. In another example, polyparaphenylene, polypyrrole, polythiophene, polyisothianaphthene, polyaniline, polyacetylene, and/or polyacene may be used to form the conductive polymer layer CPO.

An insulating layer INL may be on the conductive polymer layer CPO. The insulating layer INL may be in the opening OP of the bank 150, on the conductive polymer layer CPO.

The insulating layer INL may cover at least portions of the light-emitting elements NED that protrude above the top surface of the conductive polymer layer CPO. The insulating layer INL may fill the opening OP of the bank 150 to cover at least portions of the light-emitting elements NED. The insulating layer INL may improve the film-forming properties of the common electrode CE by filling a height difference between the conductive polymer layer CPO and the light-emitting elements NED, which protrude above the top surface of the conductive polymer layer CPO. In addition, the insulating layer INL may fix (e.g., fix in place) the light-emitting elements NED so that the light-emitting elements NED may be substantially vertically aligned with the first pixel electrode PE1. Also, the insulating layer INL may minimize or reduce the capacitance between the first pixel electrode PE1 and the common electrode CE by increasing the distance between the first pixel electrode PE1 and the common electrode CE.

The insulating layer INL may be formed of a transparent organic insulating material having insulating properties and capable of transmitting light therethrough. The transparent organic insulating material may be, for example, an acrylic resin, an epoxy resin, a phenolic resin, a polyamide resin, a polyimide resin, an unsaturated polyester resin, a polyphenylene resin, a polyphenylene sulfide resin, and/or BCB, but the present disclosure is not limited thereto. In one or more embodiments, the insulating layer INL may be formed of a transparent inorganic insulating material.

The common electrode CE may be on the insulating layer INL and the light-emitting elements NED. The common electrode CE may be formed on the entire first substrate 110 and may be on the bank 150, the insulating layer INL, and the light-emitting elements NED. The common electrode CE may be in contact with the second end portions of the light-emitting elements NED, which are positioned below the common electrode CE. As the first end portions of the light-emitting elements NED are in contact with the first pixel electrode PE1 and the second end portions of the light-emitting elements NED are in contact with the common electrode CE, the light-emitting elements NED may emit light.

Because the light-emitting elements NED, the conductive polymer layer CPO, and the insulating layer INL are between the first pixel electrode PE1 and the common electrode CE, the light-emitting elements NED may emit light in accordance with a current applied to the first pixel electrode PE1 and the common electrode CE.

Referring to FIG. 7, each of the conductive polymer layer CPO and the insulating layer INL may have a set or predetermined thickness with respect to a length L of the light-emitting elements NED. The light-emitting elements NED may be divided into lower portions LP and upper portions UP with respect to a reference line RL that crosses the length L direction and passes through about 50% of the length L of the light-emitting elements NED. The lower portions LP may be portions of the light-emitting elements NED that are adjacent to the first pixel electrode PE1, and the upper portions UP may be portions of the light-emitting elements NED that are adjacent to the common electrode CE.

The conductive polymer layer CPO may cover, and be in contact with, at least portions of the lower portions LP. The conductive polymer layer CPO may fix (e.g., fix in place) the light-emitting elements NED and may improve the electrical contact between the first pixel electrode PE1 and the light-emitting elements NED. To this end, a thickness TT1 of the conductive polymer layer CPO may be about 20% to about 40% of the length L of the light-emitting elements NED. If the thickness TT1 of the conductive polymer layer CPO is 20% or greater of the length L of the light-emitting elements NED, the electrical contact between the light-emitting elements NED and the first pixel electrode PE1 can be improved, and the light-emitting elements NED can be properly fixed. If the thickness TT1 of the conductive polymer layer CPO is 40% or less of the length L of the light-emitting elements NED, the distance between the first pixel electrode PE1 and the common electrode CE can be reduced so that an increase in the capacitance between the first pixel electrode PE1 and the common electrode CE can be prevented or reduced.

The insulating layer INL may cover, and be in contact with, at least portions of the lower portions LP and at least portions of the upper portions UP. The insulating layer INL may minimize or reduce the capacitance between the first pixel electrode PE1 and the common electrode CE. To this end, a thickness TT2 of the insulating layer INL may be about 40% to about 70% of the length L of the light-emitting elements NED. If the thickness TT2 of the insulating layer INL is 40% or greater of the length L of the light-emitting elements NED, the distance between the first pixel electrode PE1 and the common electrode CE can be widened, and as a result, the capacitance between the first pixel electrode PE1 and the common electrode CE can be minimized or reduced. If the thickness TT2 of the insulating layer INL is 70% or less of the length L of the light-emitting elements NED, the thickness of the conductive polymer layer CPO can be reduced so that deterioration of the electrical contact between the light-emitting elements NED and the first pixel electrode PE1 can be prevented or reduced.

Referring to FIG. 8, a plurality of light-emitting elements NED may be randomly (e.g., at irregular intervals with each other) positioned on the first pixel electrode PE1. The light-emitting elements NED may have substantially the same diameter and may be randomly positioned. As will be described hereinbelow, the light-emitting elements NED may be mixed in ink and may thus be randomly positioned, but the present disclosure is not limited thereto. In one or more embodiments, at least some of the light-emitting elements NED may be arranged regularly (e.g., at regular intervals with each other).

Referring again to FIGS. 5 and 7, at least portions of the light-emitting elements NED may protrude above the top surface of the insulating layer INL. End portions of the light-emitting elements NED may protrude above the top surface of the insulating layer INL to facilitate contact with the common electrode CE. The common electrode CE may cover the protruding second end portions of the light-emitting elements NED and may thus be easily (or suitably) in contact with the light-emitting elements NED.

Referring to FIG. 9, end portions of the light-emitting elements NED may be aligned with the top surface of the insulating layer INL. For example, the insulating layer INL may expose end surfaces of the light-emitting elements NED and may cover the side surfaces of the light-emitting elements NED that extend in the length direction of the light-emitting elements NED. As a result, the end surfaces of the light-emitting elements NED may be aligned with the top surface of the insulating layer INL. The common electrode CE, which is stacked on the insulating layer INL and the light-emitting elements NED, may become (e.g., may be made) flat so that the film-forming properties of the common electrode CE may be improved.

Figure 10:
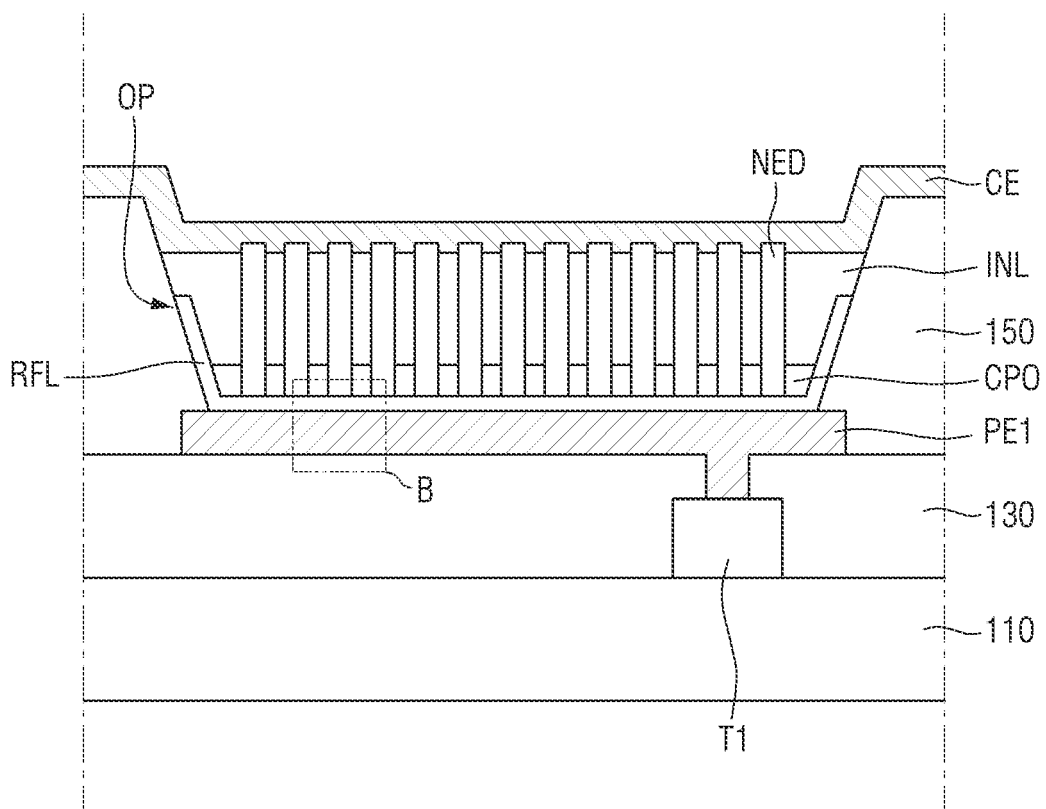
FIG. 10 is a cross-sectional view of a pixel of a display device according to another embodiment of the present disclosure.
Figure 11:
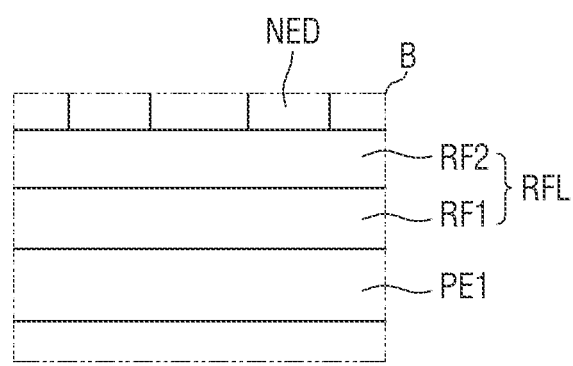
FIG. 11 is an enlarged cross-sectional view of an area B of FIG. 10.

FIG. 10 is a cross-sectional view of a pixel of a display device according to one or more other embodiments of the present disclosure. FIG. 11 is an enlarged cross-sectional view of an area B of FIG. 10.

Referring to FIGS. 10 and 11, a display device 1 of FIGS. 10 and 11 differs from the display device 1 of FIG. 1 in that it further includes a reflective electrode RFL and has a different material from the display device 1 of FIG. 1 for its first pixel electrode PE1.

Referring to FIG. 10, the reflective electrode RFL may be on a first pixel electrode PE1 and a bank 150. For example, the reflective electrode RFL may be between the first pixel electrode PE1 and light-emitting elements NED so that the bottom surface of the reflective electrode RFL may be in contact with the first pixel electrode PE1 and the top surface of the reflective electrode RFL may be in contact with the light-emitting elements NED. The reflective electrode RFL may be on at least portions of side surfaces of the bank 150 to be in contact with the bank 150. The reflective electrode RFL may be formed as an island pattern that is not in contact with the top surface of the bank 150 and is isolated between different pixels.

The reflective electrode RFL may reflect light emitted by the light-emitting elements NED in an upward direction. As the light-emitting elements NED are arranged to cross (e.g., be perpendicular to) the first pixel electrode PE1, a relatively large amount of light may be emitted in a direction crossing (e.g., perpendicular) to the length direction of the light-emitting elements NED and may become lost. Thus, the reflective electrode RFL may be provided on the side surfaces of the bank 150 and the top surface of the first pixel electrode PE1, thereby preventing or reducing the loss of light.

A conductive polymer layer CPO may cover the reflective electrode RFL, and end portions of the reflective electrode RFL may protrude above the top surface of the conductive polymer layer CPO. The protruding end portions of the reflective electrode RFL may be covered and insulated by an insulating layer INL, which is provided on the conductive polymer layer CPO. As a result, the electrical connection (e.g., undesirable electrical connection) of reflective electrode RFL to a common electrode CE can be prevented or reduced.

As the reflective electrode RFL is in direct contact (e.g., physical contact) with end portions of the light-emitting elements NED, the reflective electrode RFL may function as an anode. To this end, the reflective electrode RFL may include a transparent conductive layer RF2, which is in contact with the end portions of the light-emitting elements NED.

Referring to FIG. 11, the first pixel electrode PE1 may be formed of a low-resistance metallic material. The first pixel electrode PE1 may transmit a current provided by a first switching element T1 and may not function as an anode. Thus, the first pixel electrode PE1 may be formed of a metallic material such as, for example, Al, titanium (Ti), In, Au, and/or Ag.

Because the reflective electrode RFL, which is on the first pixel electrode PE1, is in direct contact (e.g., physical contact) with the light-emitting elements NED, the reflective electrode RFL may substantially function as an anode. To this end, the reflective electrode RFL may have a structure in which a reflective layer RF1 and the transparent conductive layer RF2 are stacked. The reflective layer RF1 may form a lower layer of the reflective electrode RFL, and the transparent conductive layer RF2 may form an upper layer of the reflective electrode RFL. For example, the reflective electrode RFL may be formed to have a structure in which the transparent conductive layer RF2 is on the reflective layer RF1.

The reflective layer RF1 may be formed of a metallic material with excellent reflectance such as, for example, Ag, Mg, Al, Pt, Pb, Au, Ni, Nd, Ir, Cr, Li, Ca, or an alloy thereof. The transparent conductive layer RF2 may be formed of a TCO with a high work function. The transparent conductive layer RF2 may be formed of, for example, ITO, IZO, ZnO, and/or $In_2O_3$. The reflective electrode RFL may have, for example, a double-layer structure of ITO/Mg, ITO/MgF, or ITO/Ag, but the present disclosure is not limited thereto. In one or more embodiments, the reflective electrode RFL may have a multilayer structure of ITO/Ag/ITO.

Because the display device 1 further includes the reflective electrode RFL between the first pixel electrode PE1 and the light-emitting elements NED, the loss of light can be prevented or reduced, and the emission efficiency of the display device 1 can be improved.

A method of manufacturing a display device according to one or more embodiments of the present disclosure will hereinafter be described.

Figure 12:
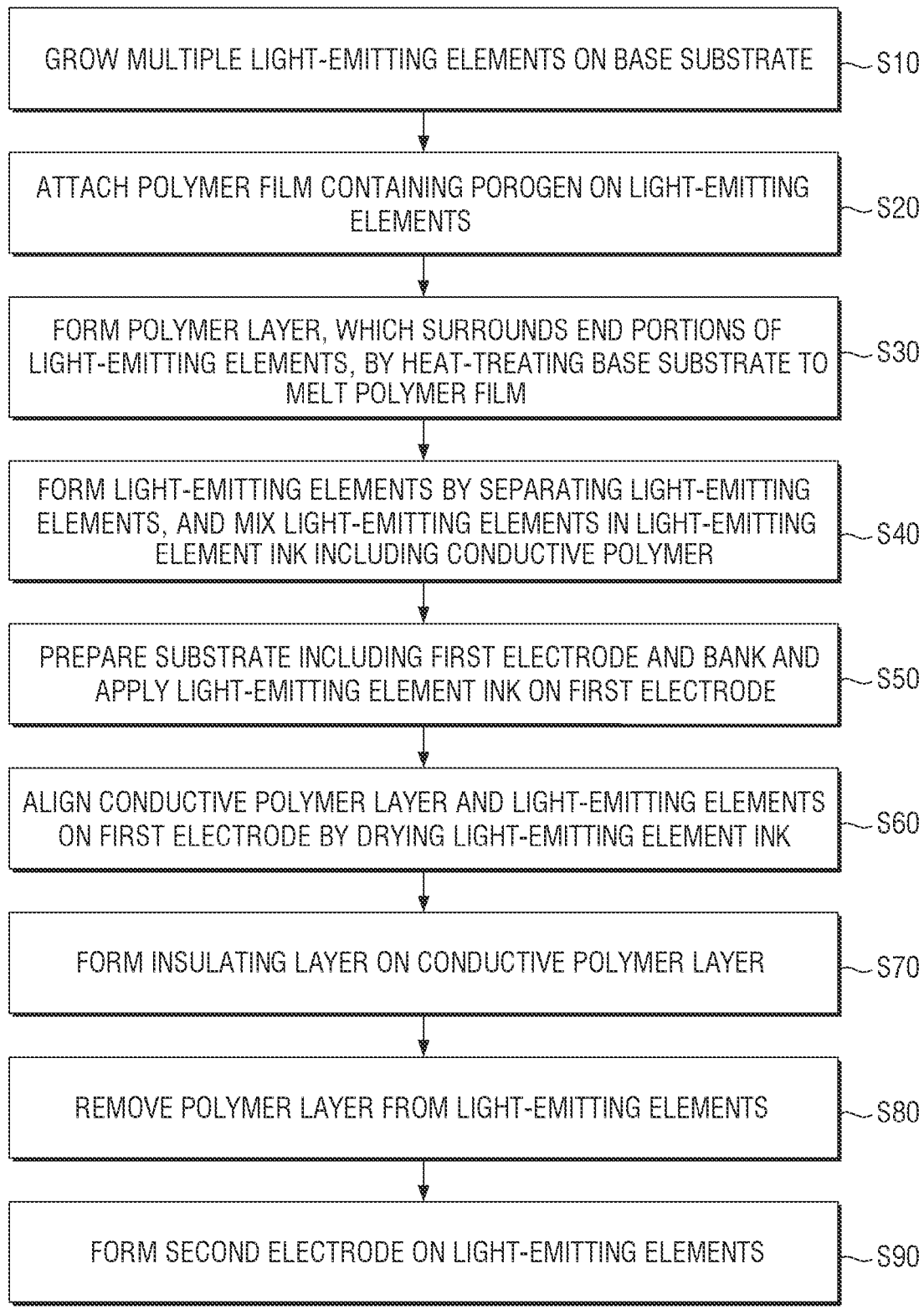
FIG. 12 is a flowchart illustrating a method of manufacturing a display device according to one or more embodiments of the present disclosure.

FIG. 12 is a flowchart illustrating a method of manufacturing a display device according to one or more embodiments of the present disclosure.

Referring to FIG. 12, the method may include: growing a plurality of light-emitting element rods on a wafer substrate (S10); attaching a polymer film including porogen on the light-emitting element rods (S20); forming a polymer layer, which surrounds end portions of the light-emitting element rods (S30) by heat-treating the wafer substrate to melt the polymer film; forming a plurality of light-emitting elements by separating the light-emitting element rods, and mixing the light-emitting elements into light-emitting element ink containing a conductive polymer (S40); preparing a target substrate including a first electrode and applying the light-emitting element ink on the first electrode (S50); aligning a conductive polymer layer and the light-emitting elements on the first electrode (S60) by drying the light-emitting element ink; forming an insulating layer on the conductive polymer layer (S70); removing the polymer layer from the light-emitting elements via etching (S80); and forming a second electrode on the light-emitting elements (S90).

The method of FIG. 12 will hereinafter be described in more detail with reference to FIGS. 13 through 25.

FIGS. 13 through 25 are cross-sectional views illustrating the method of FIG. 12. FIGS. 13 through 25 illustrate how to fabricate the display device 1 of FIG. 5, and descriptions of elements or features that have already been described above with reference to FIG. 5 will not be provided or will be simplified.

Figure 13:
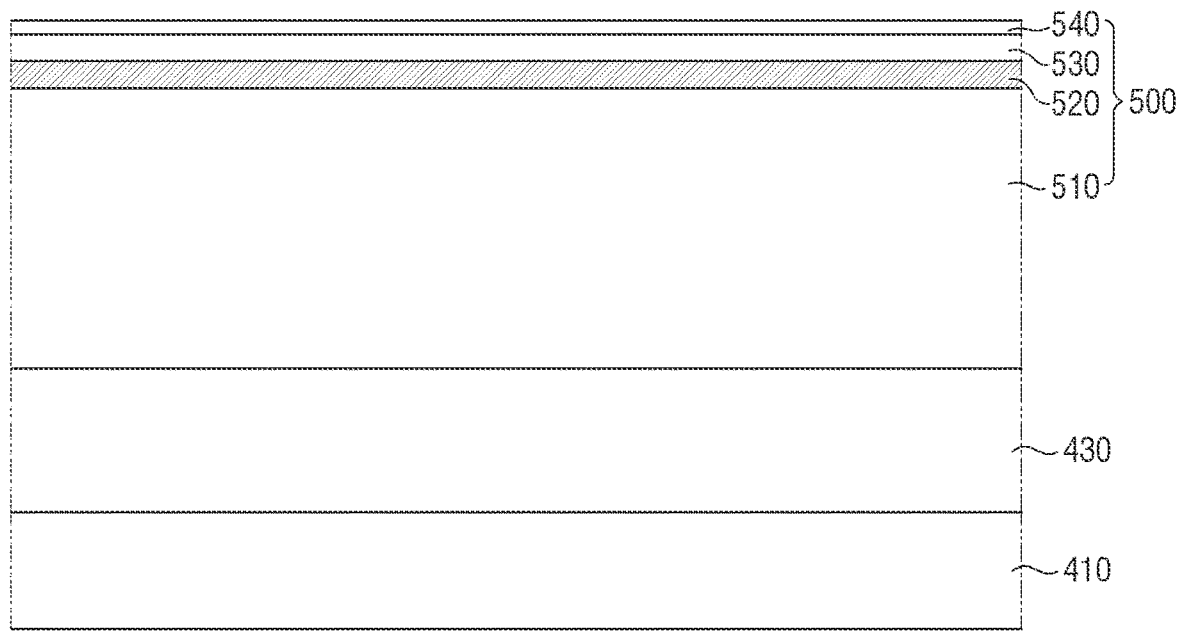
FIGS. 13-25 are cross-sectional views illustrating the method of FIG. 12.

Referring to FIG. 13, a plurality of light-emitting elements NED may be grown on a base substrate 410 (S10). The base substrate 410 may include a sapphire ($Al_2O_3$) substrate or a transparent substrate such as a glass substrate, but the present disclosure is not limited thereto. In one or more embodiments, the base substrate 410 may be formed as a conductive substrate including GaN, SiC, ZnO, Si, GaP, and/or GaAs. It will hereinafter be described that the base substrate 410 is a sapphire substrate. The thickness of the base substrate 410 is not particularly limited. In one or more example embodiments, the base substrate 410 may have a thickness of about 400 μm to about 1500 μm.

Thereafter, a buffer layer 430 is formed on the base substrate 410. The buffer layer 430 is illustrated as being a single layer, but the present disclosure is not limited thereto. In one or more embodiments, the buffer layer 430 may be formed as a multilayer. The buffer layer 430 may reduce the difference in lattice constant between the base substrate 410 and a first semiconductor material layer that will be described hereinbelow.

In one or more example embodiments, the buffer layer 430 may include an undoped semiconductor and may include substantially the same material as the first semiconductor material layer, e.g., a material not doped with an n- or p-type dopant. In one or more example embodiments, the buffer layer 430 may include at least one selected from InAlGaN, GaN, AlGaN, InGaN, AlN, and InN that are not doped, but the present disclosure is not limited thereto. The buffer layer 430 may not be provided depending on the base substrate 410. It will hereinafter be described that the buffer 430 including an undoped semiconductor is formed on the base substrate 410.

Thereafter, a semiconductor structure 500 including a first semiconductor material layer 510, a light-emitting material layer 520, a second semiconductor material layer 530, and an electrode material layer 540 is formed on the buffer layer 430. The semiconductor structure 500 may include the first semiconductor material layer 510, the light-emitting material layer 520, which is on the first semiconductor material layer 510, the second semiconductor material layer 530, which is on the light-emitting material layer 520, and the electrode material layer 540, which is on the second semiconductor material layer 530. Multiple material layers included in the semiconductor structure 500 may be formed by one or more suitable processes, and may correspond to multiple layers included in each of the light-emitting elements NED. For example, the first semiconductor material layer 510, the light-emitting material layer 520, the second semiconductor material layer 530, and the electrode material layer 540 may include the same materials as a first semiconductor layer 31, a light-emitting layer 36, a second semiconductor layer 32, and an electrode layer 37, respectively, of each of the light-emitting elements NED.

Figure 14:
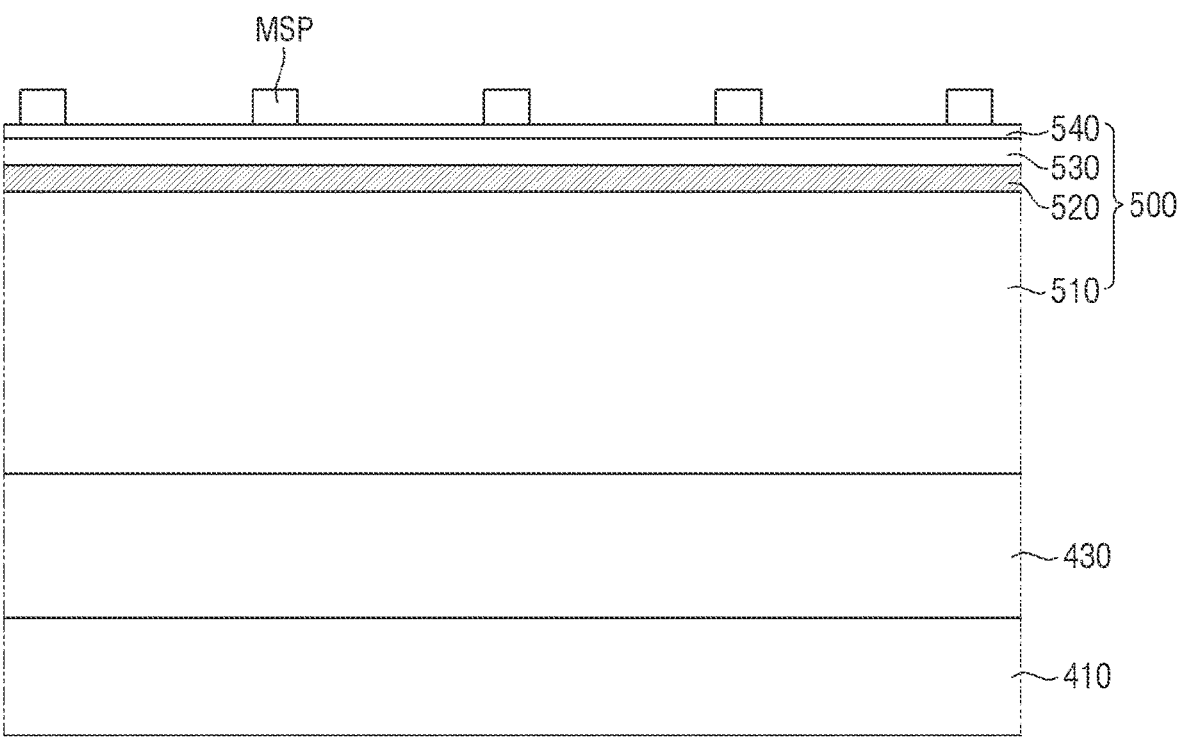

Thereafter, referring to FIG. 14, a plurality of mask patterns MSP are formed on the semiconductor structure 500. For example, the base substrate 410 with the semiconductor structure 500 formed thereon is coated with photoresist and is then subjected to exposure (e.g., light exposure) and development, thereby forming the mask patterns MSP. The mask patterns MSP may have a circular shape in a plan view, but the present disclosure is not limited thereto. The shape of the mask patterns MSP may vary depending on the shape of the light-emitting elements NED.

Figure 15:
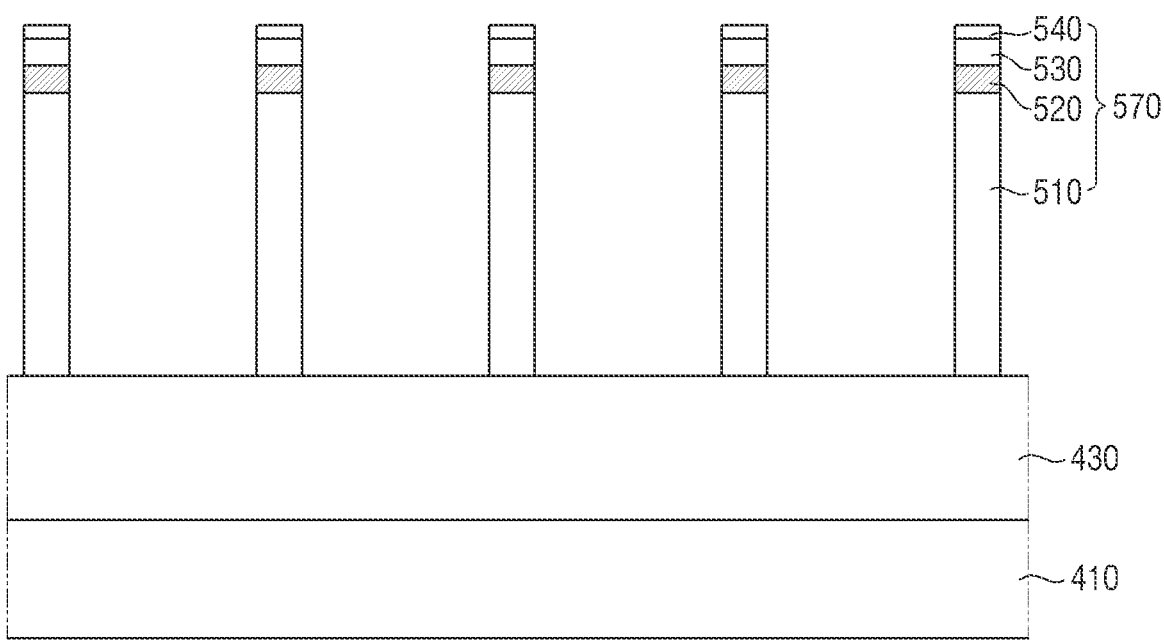

Thereafter, referring to FIG. 15, light-emitting element rods 570 are formed by removing portions of the semiconductor structure 500 using the mask patterns MSP. The semiconductor structure 500 may be etched by any suitable method. In one or more example embodiments, the semiconductor structure 500 may be etched in a direction crossing (e.g., perpendicular to) the base substrate 410, along the mask patterns MSP.

In one or more example embodiments, the etching of the semiconductor structure 500 may be performed by dry etching, wet etching, reactive ion etching (RIE), and/or inductively coupled plasma-RCE (ICP-RIE). The semiconductor structure 500 may be etched by dry etching, which is anisotropic etching and may thus be suitable for vertical etching. In this example, $Cl_2$ or $O_2$ may be used as an etchant. However, the present disclosure is not limited to this example. In some embodiments, the semiconductor structure 500 may be etched by both dry etching and wet etching. In one or more example embodiments, the semiconductor structure 500 may be etched in a depth direction first by dry etching and may then be etched by wet etching, which is isotropic etching, such that etched sidewalls of the semiconductor structure 500 may be placed on a plane that is crossing (e.g., perpendicular to) the surface of the buffer layer 430. The buffer layer 430 may not be etched during the removal of the semiconductor structure 500. The mask patterns MSP that remain on the light-emitting element rods 570 may be stripped away.

Figure 16:
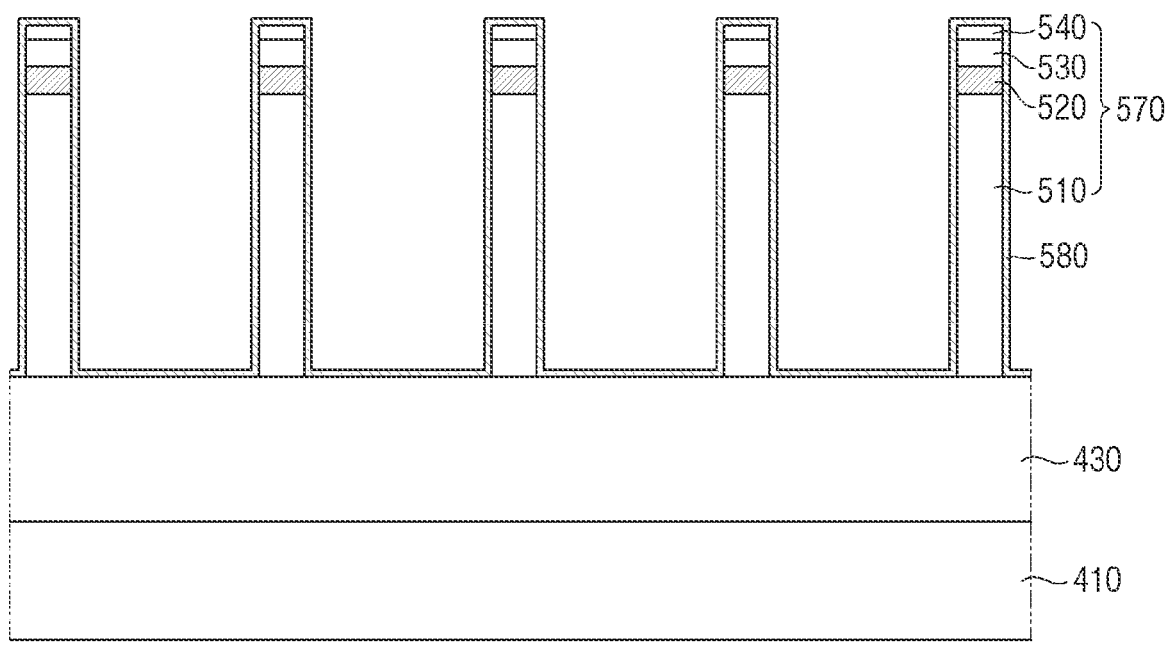

Thereafter, referring to FIG. 16, an insulating material layer 580 may be formed on the base substrate 410 to surround the outer surfaces of the light-emitting element rods 570, which are formed to be spaced apart from one another. The insulating material layer 580 may be partially etched in a subsequent process, thereby forming an insulating film 590 (shown in FIG. 17). The insulating material layer 580 may surround the top surface of the buffer layer 430 and the outer surfaces of the light-emitting element rods 570. Accordingly, the insulating material layer 580 may be to surround the outer surfaces of the first semiconductor material layer 510, the light-emitting element layer 520, the second semiconductor material layer 530, and the electrode material layer 540 in each of the light-emitting element rods 570.

The insulating material layer 580 may be formed by applying an insulating material on the outer surfaces of the light-emitting element rods 570, which are vertically etched, or immersing the light-emitting element rods 570 in an insulating material, but the present disclosure is not limited thereto. In one or more example embodiments, the insulating material layer 580 may be formed by atopic layer deposition (ALD). The insulating material layer 580 may be formed of one of $SiO_x$, $SiN_x$, $SiO_xN_y$, $Al_2O_3$, or AlN.

Figure 17:
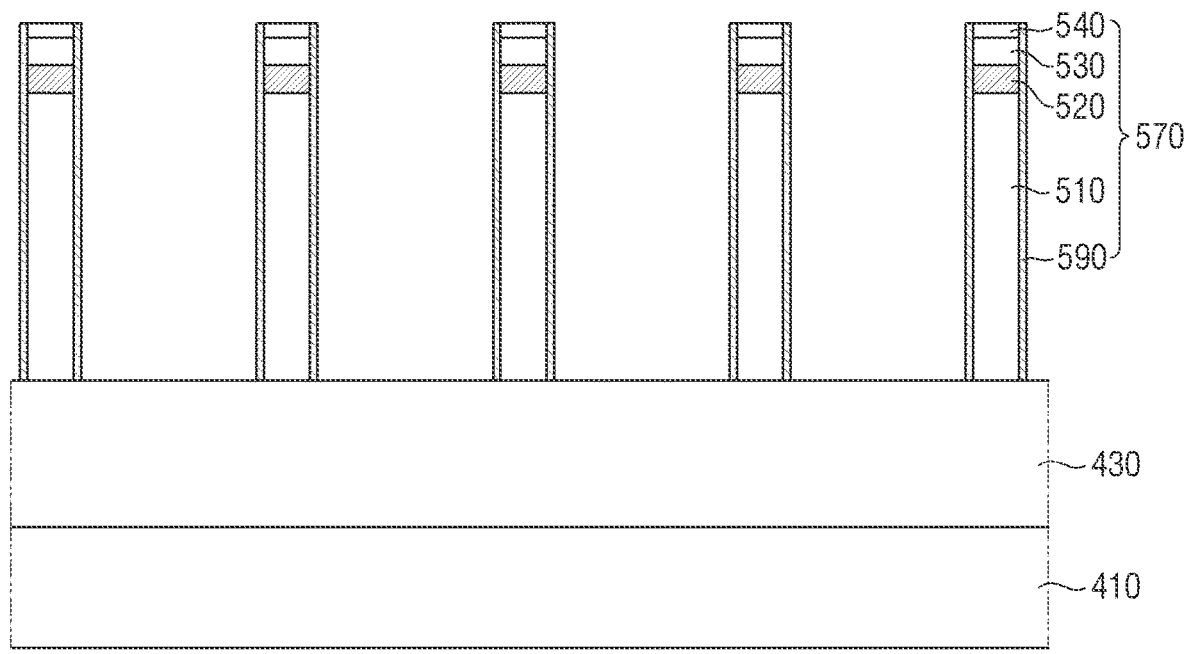

Thereafter, referring to FIG. 17, the insulating film 590 is formed by partially removing the insulating material layer 580. The etching of the insulating material layer 580 may be performed on the entire surface of the base substrate 410. The insulating material layer 580 may be etched away from the top surfaces of the light-emitting element rods 570 and from regions between the light-emitting element rods 570. The etching of the insulating material layer 580 may be performed by anisotropic etching such as dry etching and/or etch-back. As a result of the etching of the insulating material layer 580, the insulating material layer 580 may be partially removed, and the top surface of the electrode material layer 540 and portion of the buffer layer 430 may be exposed. The remaining insulating material layer 580 may form the insulating film 590.

In one or more embodiments, an ion doping process may be performed on the light-emitting element rods 570. The ion doping process can improve the dispersibility of light-emitting elements during inkjet printing by controlling the surface polarity of the light-emitting element rods 570 via a low-temperature plasma method.

The ion doping process can dope an N-type dopant such as, for example, antimony (Sb), arsenic (As), boron (B), boron trifluoride ($BF_3$), and/or diboron trihydride ($B_2H_3$), to a concentration of about $10e^{12}/cm^3$ to about $10e^{18}/cm^3$.

Figure 18:
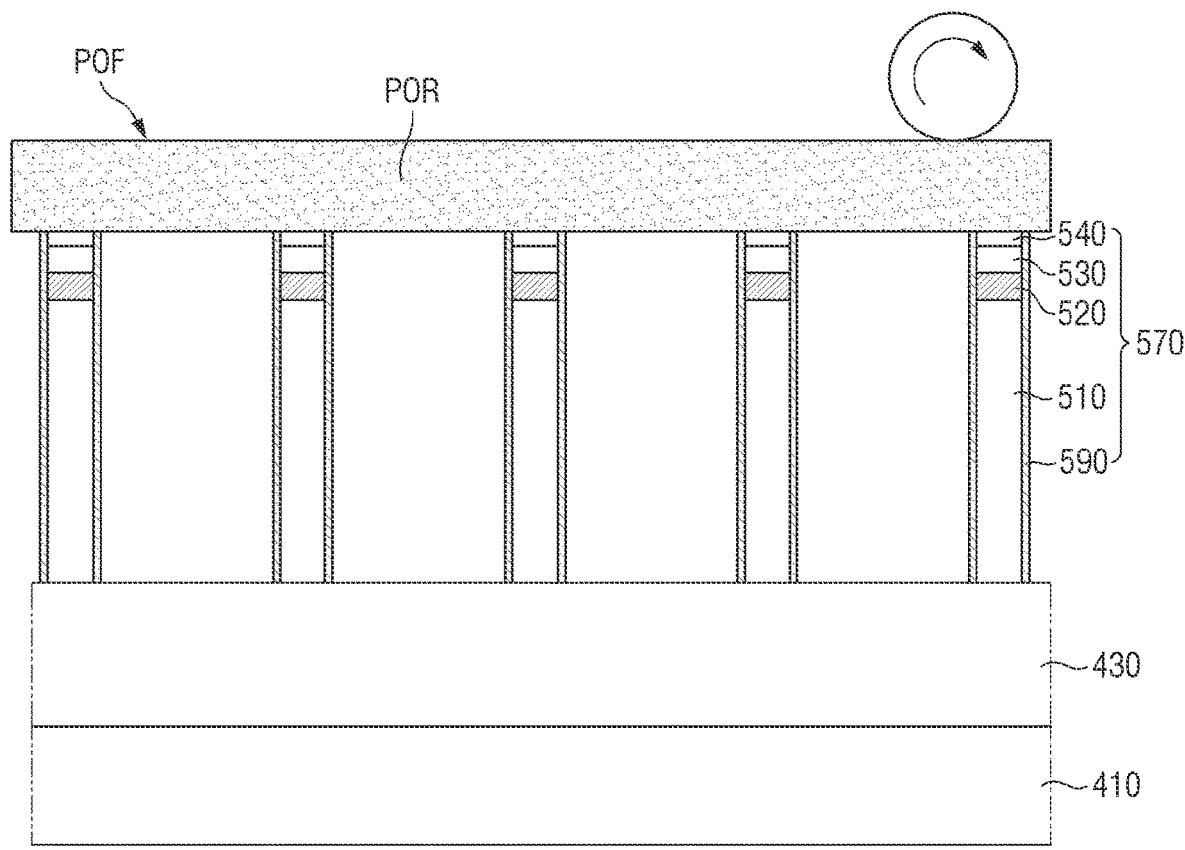

Thereafter, referring to FIG. 18, a polymer film POF containing porogen (POR) is attached on the light-emitting element rods 570 (S20).

The polymer film POF may be fabricated in the form of a film by mixing a transparent polymer resin and a porogen compound. For example, a polymer resin composition containing the porogen POR, a polymer resin, and a solvent is prepared.

An acrylate resin and/or an epoxy resin may be used as the transparent polymer resin, but the present disclosure is not limited thereto. Any suitable polymer resin that can be used to fabricate a transparent film may be used.

Nearly all types (or kinds) of organic, inorganic, or organic-inorganic materials that are decomposed at a temperature of 400° C. or lower to form pores may be used as the porogen POR. In one or more example embodiments, the porogen POR may be selected from among a polymeric dendrimer; a decomposable linear polymer such as polyester, polystyrene, PMS, polyacrylate, PMA, polycarbonate, and/or polyether; a polynorbone-based polymer; an organic solvent having a high boiling point such as tetradecane, and/or a cyclodextrin-based derivative; an ionic surfactant such as cetyl trimethylammonium bromide salt (C16TMABr); a nonionic surfactant such as polyethylene oxide-polyphenylene oxide-polyethylene oxide (PEO-PPO-PEO); polyalkylene oxide, poly(caprolactone), poly(valeractone), and/or poly(methyl methacrylate) (PMMA).

The polymer resin composition may include about 15% to about 30% by weight of a polymer resin with respect to 100% by weight of the polymer resin composition and about 10 to about 40% by weight of a porogen with respect to 100% by weight of the polymer resin. In one or more embodiments, a fluorine-based additive may be further added to impart hydrophobicity to the polymer resin composition. The polymer resin composition may be cured in the form of a thin film to be fabricated as the polymer film POF including the porogen POR. The polymer film POF may be attached in a lamination method.

Thereafter, a polymer layer POL, which surrounds end portions of the light-emitting element rods 570, is formed (S30) by heat-treating the base substrate 410 to melt the polymer film POF.

Figure 19:
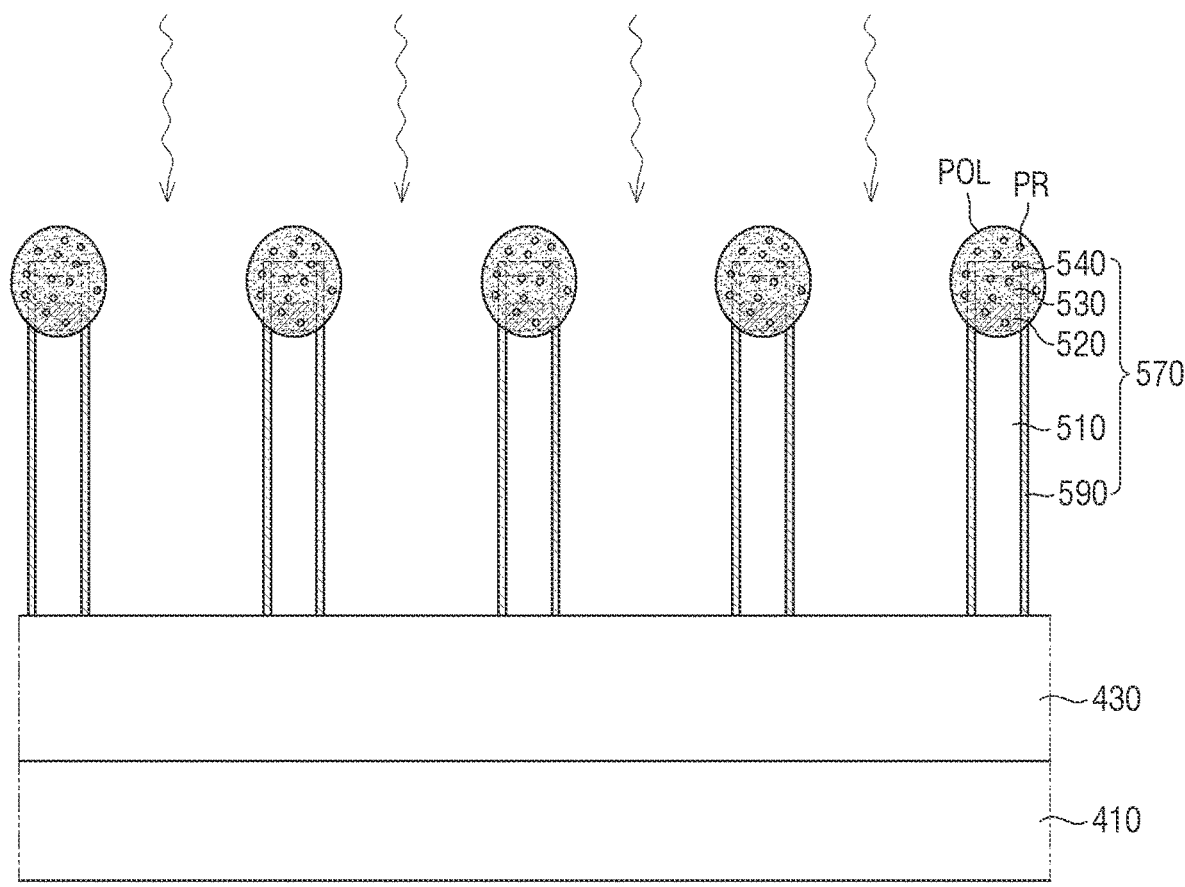

Thereafter, referring to FIG. 19, the heat treatment of the base substrate 410 may be performed to vaporize and remove the porogen POR from the polymer film POF and thus to form pores. The base substrate 410 with the polymer film POF attached thereon may be inserted in a chamber and may be heat-treated in the chamber at a pressure of about 0.05 MPa to about 2.0 MPa and a temperature of about 100° C. to about 250° C. for 10 minutes to 30 minutes.

Once the heat treatment of the base substrate 410 is performed, the polymer film POF, which is on the light-emitting element rods 570, may be melted, the porogen POR included in the polymer film POF may be vaporized, and as a result, pores may be formed. By controlling the content of the porogen POR, pores having a size of about 10 nm to about 1,000 nm may be formed. As illustrated in FIG. 19, once the polymer film POF is melted, the polymer layer POL may be formed to surround upper end portions of the light-emitting element rods 570. As the porogen POR is vaporized from the polymer layer POL, a plurality of pores PR may be included in the polymer layer POL.

In one or more embodiments, the polymer layer POL may be formed by dipping the light-emitting element rods 570 in the polymer resin composition and then heat-treating the light-emitting element rods 570.

Thereafter, a plurality of light-emitting elements NED are formed by separating the light-emitting element rods 570, and the light-emitting elements NED may be mixed in light-emitting element ink including a conductive polymer (S40).

In one or more embodiments, the light-emitting element rods 570 with the polymer layer POL formed thereon are separated from the base substrate 410. The light-emitting element rods 570 may be separated from the base substrate 410, thereby obtaining the light-emitting elements NED. The polymer layer POL, which surrounds an end portion of each of the light-emitting elements NED and includes multiple pores PR, may be on each of the light-emitting elements NED.

Figure 20:
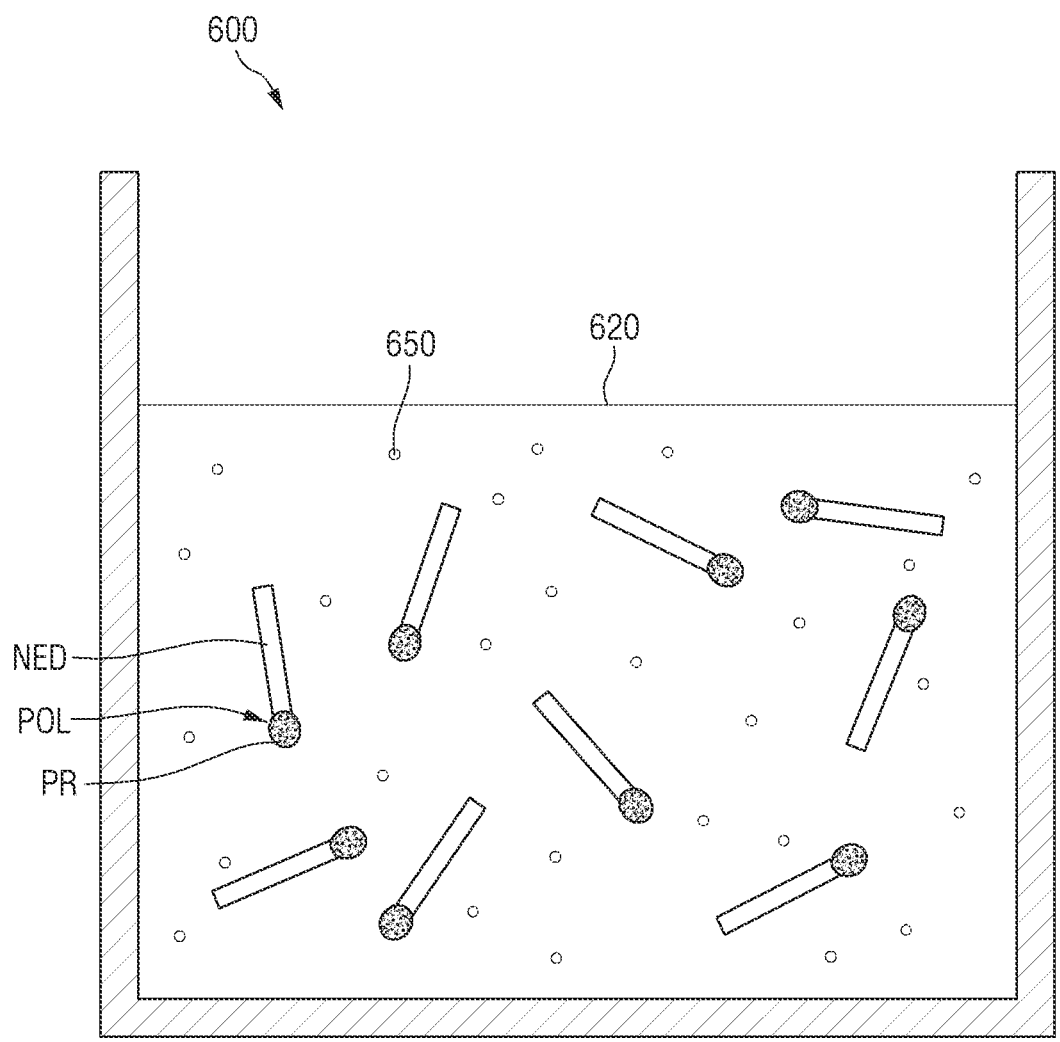

Referring to FIG. 20, light-emitting element ink 600 including the light-emitting elements NED is prepared. The light-emitting element ink 600 may include a solvent 620 and the light-emitting elements NED and a conductive polymer 650, which are dispersed in the solvent 620. The light-emitting elements NED and the conductive polymer 650 may be evenly (e.g., substantially evenly) distributed in the solvent 620.

The light-emitting element ink 600 may be obtained by mixing the light-emitting elements NED, the solvent 620, and the conductive polymer 650. A dispersant may be further mixed into the light-emitting element ink 600. For example, the light-emitting element ink 600 may be obtained by a primary dispersion process that mixes the light-emitting elements NED, the conductive polymer 650, and the solvent 620, and a secondary dispersion process that adds a dispersant to the mixture obtained by the primary dispersion process.

The light-emitting elements NED and the conductive polymer 650 may be mixed in the solvent 620 and may then be mixed for five or more minutes. The light-emitting elements NED may be included in an amount of about 0.01 to about 1 parts by weight with respect to 100 parts by weight of the light-emitting element ink 600, and the conductive polymer 650 may be included in an amount of about 1 to about 10 parts by weight with respect to 100 parts by weight of the light-emitting element ink 600. The mixing of the light-emitting elements NED, the conductive polymer 650, and the solvent 620 may be performed by sonication, stirring, and/or milling.

The light-emitting element ink 600 may be stored at room temperature (e.g., a temperature of 23° C.). The conductive polymer 650 in the light-emitting element ink 600 may be evenly (e.g., substantially evenly) distributed with the solvent 620 and the light-emitting elements NED. The light-emitting elements NED may be maintained to be dispersed almost without being precipitated.

Thereafter, a first substrate 110 including a first pixel electrode PE1 and a bank 150 is prepared, and the light-emitting element ink 600 is applied on the first pixel electrode PE1 (S50).

Figure 21:
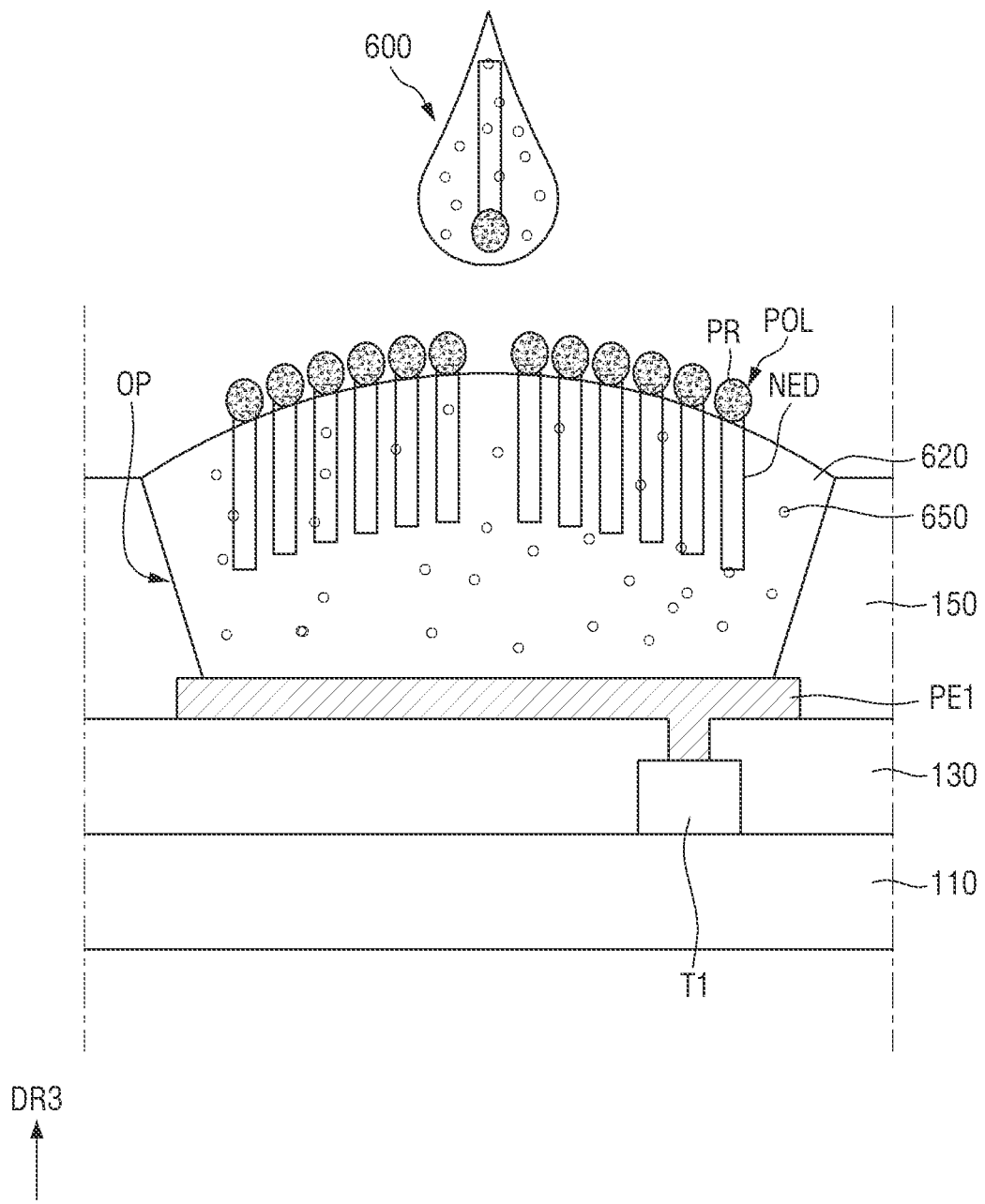

Referring to FIG. 21, a first substrate 110 including a first switching element T1, a planarization film 130, the first pixel electrode PE1, and the bank 150 is prepared. Thereafter, the light-emitting element ink 600 is sprayed on the first substrate 110. In one or more example embodiments, the light-emitting element ink 600 may be sprayed on the first pixel electrode PE1 via inkjet printing by an inkjet printing device. The light-emitting element ink 600 may be sprayed via the nozzles of an inkjet head included in the inkjet printing device. The light-emitting element ink 600 may flow along an internal flow path provided in the inkjet head and may then be ejected onto the first substrate 110 through the nozzles of the inkjet head. Then, the light-emitting element ink 600 may be settled on the first pixel electrode PE1 on the first substrate 110. Once the light-emitting element ink 600 is sprayed on the first pixel electrode PE1, the light-emitting element ink 600 may be evenly (e.g., substantially evenly) spread in an opening OP of the bank 150 without spilling over the bank 150. Accordingly, the light-emitting elements NED and the conductive polymer 650, which are dispersed in the light-emitting element ink 600, can be evenly (e.g., substantially evenly) distributed in the bank 150.

In one or more example embodiments, the light-emitting elements NED may be arranged to float in a direction crossing (e.g., perpendicular) with respect to the first pixel electrode PE1, inside the light-emitting element ink 600 sprayed on the first pixel electrode PE1. As the polymer layer POL with multiple pores PR is provided at one end of each of the light-emitting elements NED, the specific gravity of the ends of the first light-emitting elements NED where the polymer layer POL is positioned may be lower than the specific gravity of the other ends of the first light-emitting elements NED. Thus, the ends of the first light-emitting elements NED where the polymer layer POL is positioned may float above the surface of the light-emitting element ink 600 due to buoyance. As the ends of the light-emitting elements NED where the polymer layer POL is not positioned have a relatively high specific gravity, the ends of the light-emitting elements NED where the polymer layer POL is not positioned may sink in the light-emitting element ink 600 so that the light-emitting elements NED may be vertically (or substantially vertically) aligned.

Also, as the electron content of the light-emitting elements NED increases as a result of the aforementioned ion doping process, an electrical repulsive force may react upon the solvent 620 of the light-emitting element ink 600 and may thus contribute to the vertical (or substantially vertical) alignment of the light-emitting elements NED.

Because the polymer layer POL, which is at one end of each of the light-emitting elements NED, has low surface energy due to the inherent properties of a polymer, the contact area of the polymer layer POL and the solvent 620 of the light-emitting element ink 600 may be minimized or reduced, so that the polymer layer POL may float on the light-emitting element ink 600. Accordingly, the ends of the light-emitting elements NED with the polymer layer POL thereon may float above the surface of the light-emitting element ink 600.

Thereafter, a conductive polymer layer CPO and the light-emitting elements NED are aligned on the first pixel electrode PE1 (S60) by drying the light-emitting element ink 600.

Figure 22:
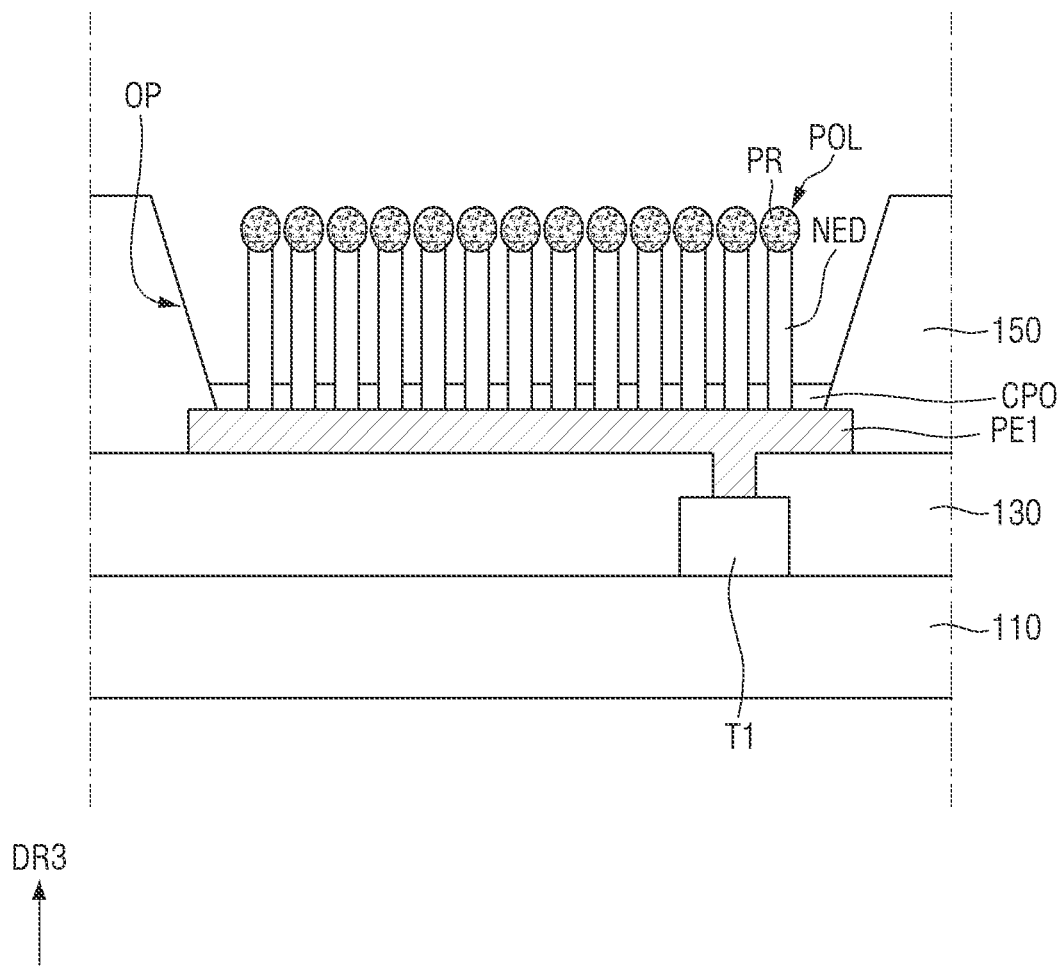

Referring to FIG. 22, the drying of the light-emitting element ink 600 may be performed in a chamber capable of controlling the pressure therein. The solvent 620 of the light-emitting element ink 600 may be removed by applying heat onto the first substrate 110 within the chamber with the pressure therein controlled.

The solvent 620 may be completely removed by heat treatment under low-pressure conditions. In one or more example embodiments, the removal of the solvent 620 may be performed at a temperature of about 10-4 Torr to about 1 Torr and a temperature of about 25° C. to about 150° C. In this case, the boiling point of the solvent 620 may decrease, and as a result, the solvent 620 can be easily removed. Heat treatment may be performed in the chamber for 1 minute to 30 minutes, but the present disclosure is not limited thereto.

As the solvent 620 is removed, the light-emitting elements NED, which are vertically (or substantially vertically) aligned on the first pixel electrode PE1, may be lifted down and may be settled on the first pixel electrode PE1. The conductive polymer 650 may remain on the first pixel electrode PE1 and may be cured by heat treatment so that the vertical (or substantially vertical) alignment of the light-emitting elements NED may be maintained and fixed.

Thereafter, an insulating layer INL is formed on the conductive polymer layer CPO (S70).

Figure 23:
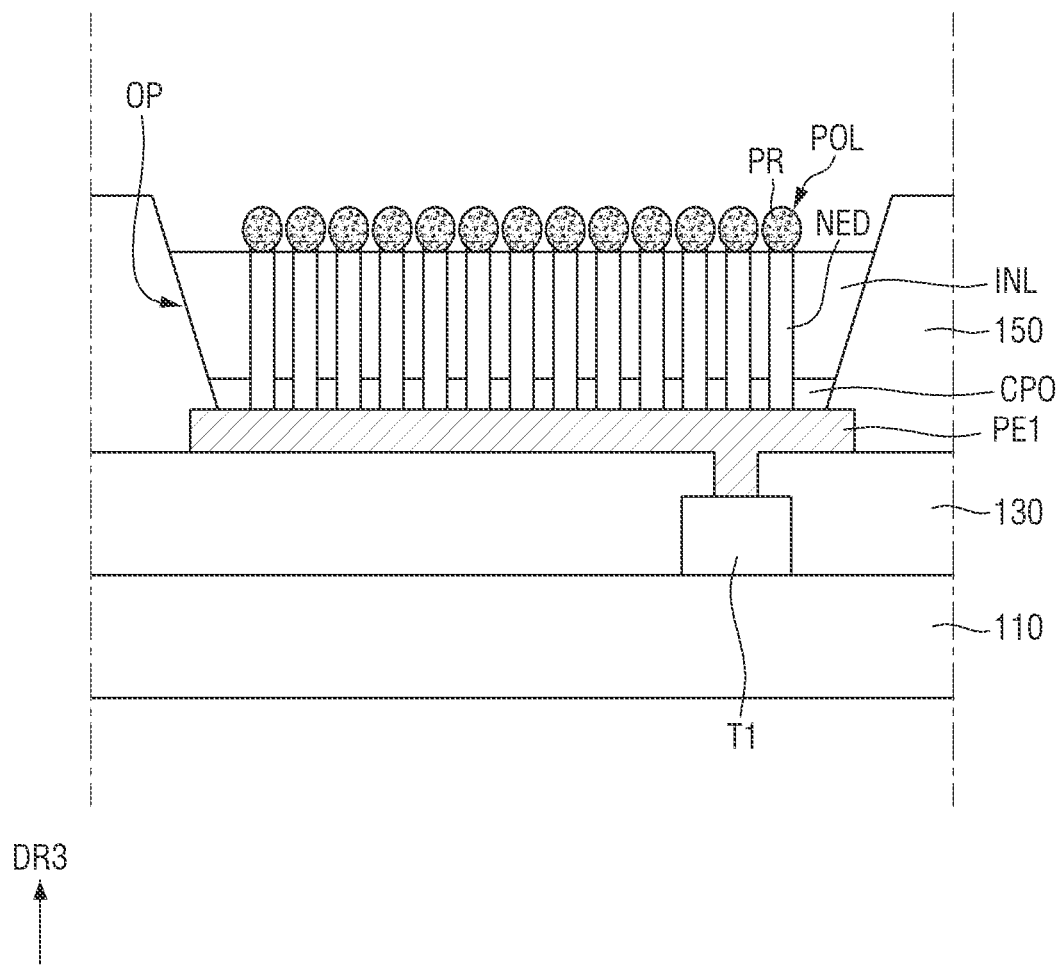

Referring to FIG. 23, the insulating layer INL is formed on the first substrate 110 with the light-emitting elements NED and the conductive polymer layer CPO formed thereon. The insulating layer INL may be applied on the conductive polymer CPO by inkjet printing. If the conductive polymer layer CPO is formed by inkjet printing, the thickness of the conductive layer CPO may not be easily controlled, and the light-emitting elements NED may be completely covered by the insulating layer INL. In this case, the insulating layer INL may be thinned down by a method such as ashing so that at least portions of the light-emitting elements NED, e.g., the polymer layer POL at one end of each of the light-emitting elements NED, may be exposed above the top surface of the insulating layer INL. However, the present disclosure is not limited to this. In one or more embodiments, the insulating layer INL may be formed of an organic material by applying the organic material via a solution process such as, for example, spin coating, and patterning the organic material. In one or more embodiments, the insulating layer INL may be formed of an inorganic material by depositing the inorganic material via chemical vapor deposition (CVD) and patterning the inorganic material.

Thereafter, the polymer layer POL is removed from the light-emitting elements NED (S80).

Figure 24:
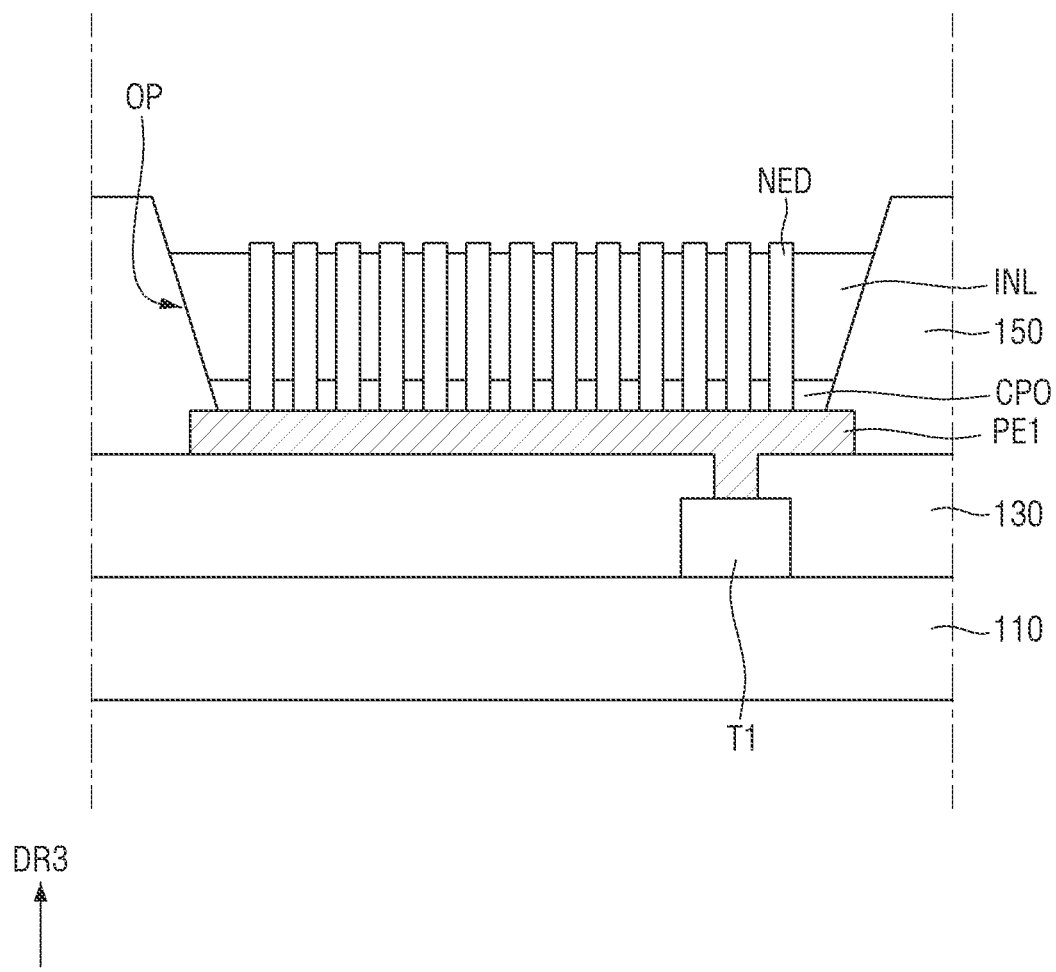

Referring to FIG. 24, the polymer layer POL, which is positioned at one end of each of the light-emitting elements NED, is removed. The polymer layer POL may be removed for contact with a common electrode CE that will be described hereinbelow. The polymer layer POL may be removed by etching or ashing. As the polymer layer POL is removed, the pores PR of the polymer layer POL are also removed so that only the light-emitting elements NED remain.

Thereafter, the common electrode CE is formed on the light-emitting elements NED (S90).

Figure 25:
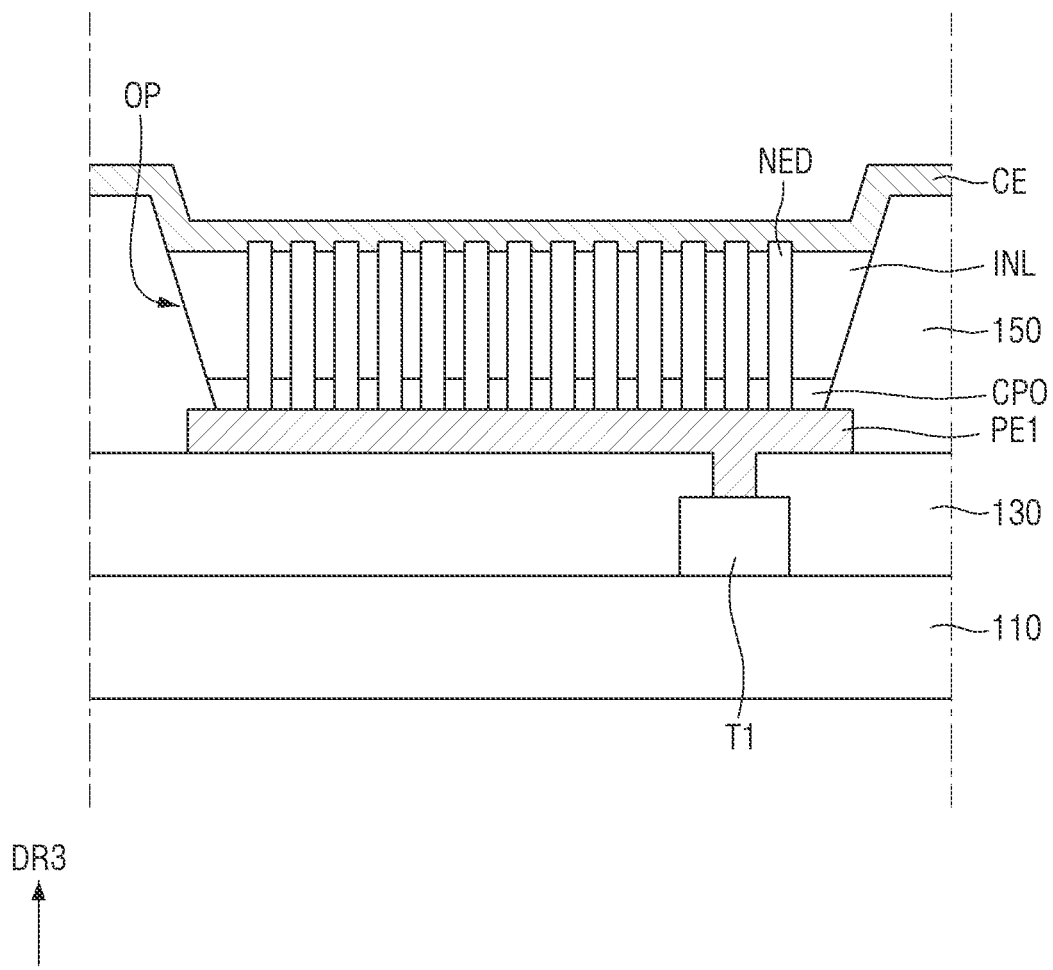

Referring to FIG. 25, the common electrode CE is formed by depositing a common electrode material on the first substrate 110 with the insulating layer INL formed thereon. In this manner, the display device 1 of FIG. 5 may be obtained.

According to the method of FIG. 12, a display device including light-emitting elements can be easily fabricated by vertically (or substantially vertically) aligning the light-emitting elements on a pixel electrode to be in contact with a common electrode.

FIGS. 26 through 29 are cross-sectional views illustrating a method of manufacturing a display device according to one or more other embodiments of the present disclosure.

FIGS. 26 through 29 illustrate how to fabricate the display device 1 of FIG. 10, and descriptions of elements or features that have already been described above with reference to FIGS. 13 through 25 will not be provided or will be simplified.

Figure 26:
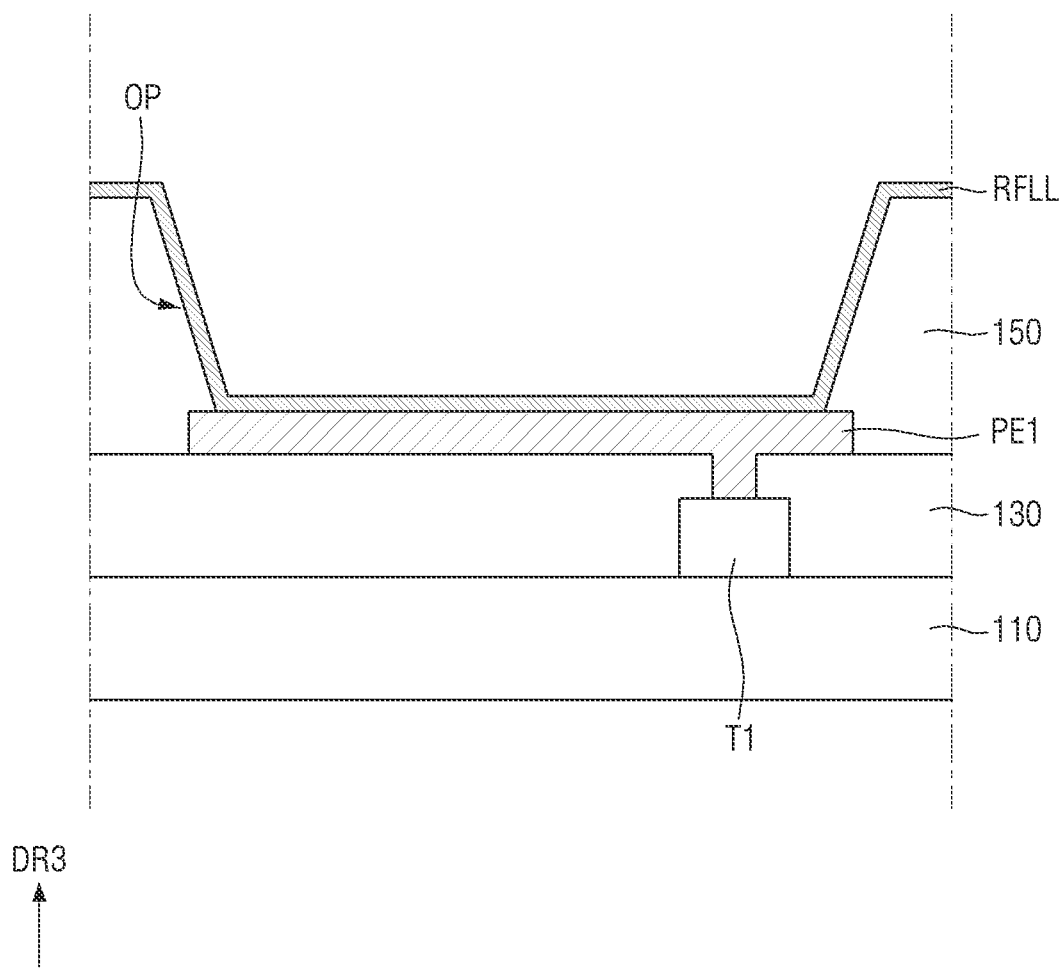
FIGS. 26-29 are cross-sectional views illustrating a method of manufacturing a display device according to one or more other embodiments of the present disclosure.

Referring to FIG. 26, a first substrate 110 with a first pixel electrode PE1 and a bank 150 formed thereon is prepared, and a reflective material layer RFLL is deposited on the first substrate 110. The reflective material layer RFLL may be formed on the top surface of the first pixel electrode PE1 and on the top surface and side surfaces of the bank 150.

Figure 27:
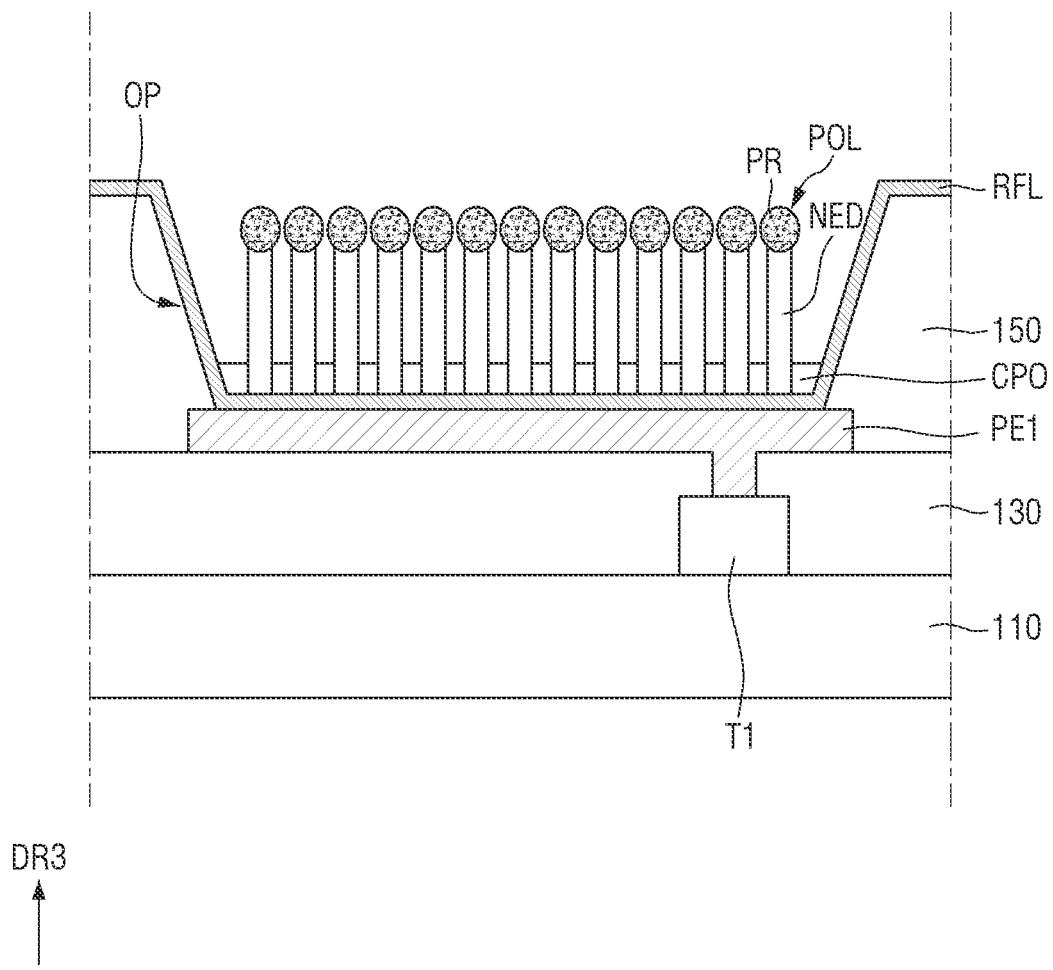

Thereafter, referring to FIG. 27, as already described above with reference to FIGS. 20 through 22, light-emitting element ink 600 having light-emitting elements NED, a conductive polymer 650, and a solvent 620 mixed therein is applied and dried so that a conductive polymer layer CPO and the light-emitting elements NED are aligned on the reflective material layer RFLL on the first pixel electrode PE1.

Figure 28:
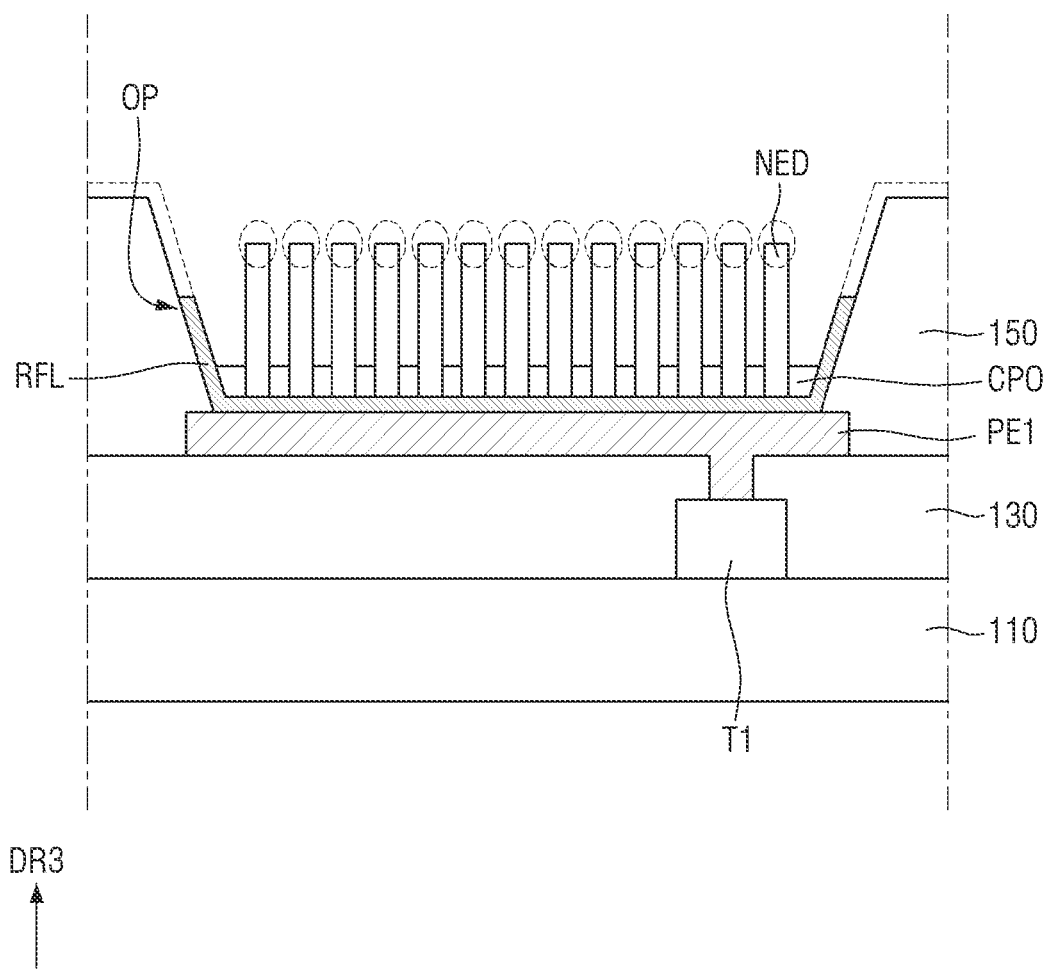

Thereafter, referring to FIG. 28, a polymer layer POL of each of the light-emitting elements NED and the reflective material layer RFLL are etched. The polymer layer POL may be removed by, for example, ashing, and the reflective material layer RFLL may be patterned by photolithography. As a result, a reflective electrode RFL may be formed on the top surface of the first pixel electrode PE1 and on the side surfaces of the bank 150. The light-emitting elements NED may be in contact with the top surface of the reflective electrode RFL and may be vertically (or substantially vertically) aligned on the first pixel electrode PE1.

Figure 29:
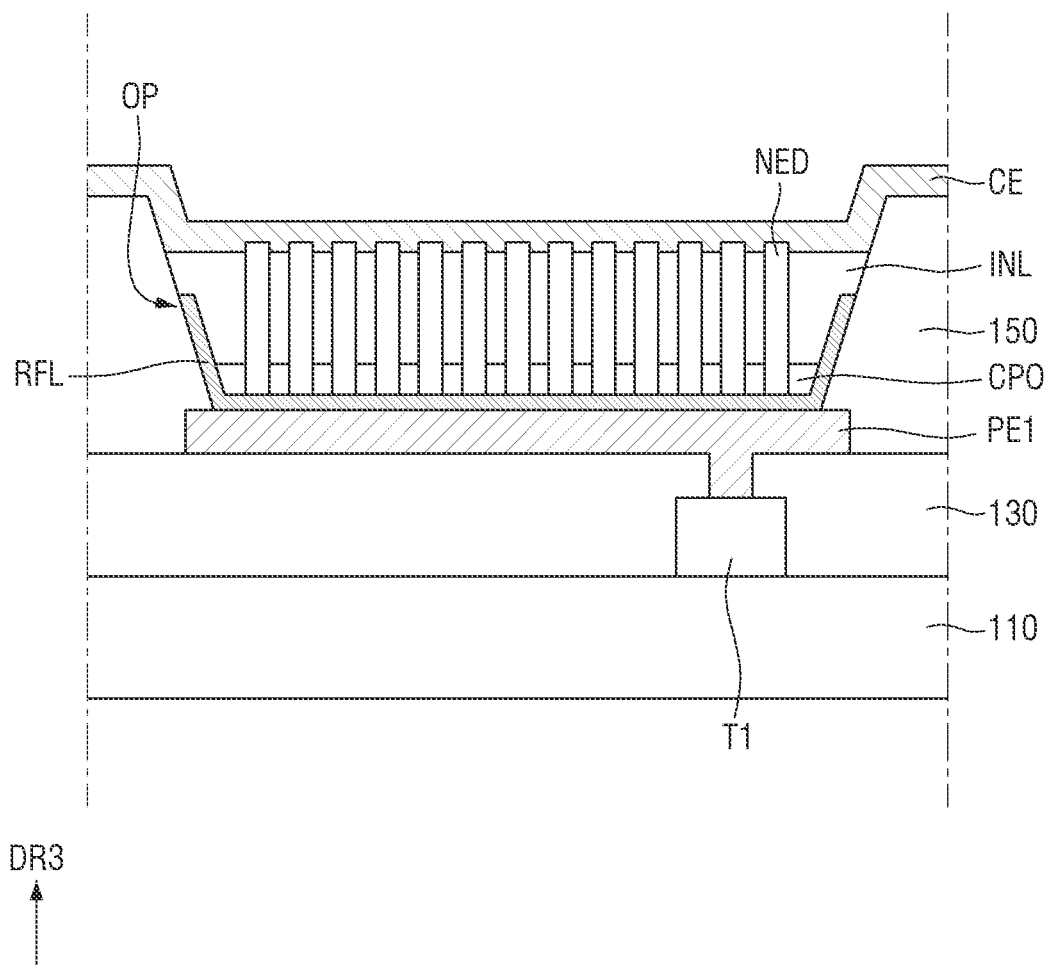

Thereafter, referring to FIG. 29, an insulating layer INL is formed on the light-emitting elements NED and the reflective electrode RFL, and a common electrode CE is formed on the insulating layer INL and the light-emitting elements NED, thereby obtaining the display device 1 of FIG. 10. The insulating layer INL may completely cover the reflective electrode RFL and may prevent or reduce the risk of the reflective electrode RFL being connected (e.g., coupled) to the common electrode CE. The insulating layer INL may be formed to expose end portions of the light-emitting elements NED and thus to allow the light-emitting elements NED to be in contact with the common electrode CE.

Accordingly, as a reflective electrode capable of reflecting light from light-emitting elements, in an upward direction, is formed, the emission efficiency of the light-emitting elements can be improved.

In concluding the detailed description, those skilled in the art will appreciate that many variations and modifications can be made to the embodiments described herein without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A display device comprising:
   a first electrode on a substrate;
   a bank covering edges of the first electrode;
   a plurality of light-emitting elements on the first electrode and aligned vertically with respect to the first electrode;
   a conductive polymer layer on the first electrode to fill gaps between adjacent ones of the plurality of light-emitting elements;
   an insulating layer on the conductive polymer layer to fill the gaps between adjacent ones of the plurality of light-emitting elements; and
   a second electrode on the bank, the insulating layer, and the plurality of light-emitting elements.

2. The display device of claim 1, wherein first end portions of the plurality of light-emitting elements are in contact with the first electrode.

3. The display device of claim 2, wherein the plurality of light-emitting elements comprise lower portions and upper portions, which are defined relative to a reference line that crosses a length direction of the plurality of light-emitting elements and passes through about 50% of a length of the plurality of light-emitting elements.

4. The display device of claim 3, wherein
   the conductive polymer layer is in contact with the lower portions of the plurality of light-emitting elements, and
   a thickness of the conductive polymer layer is about 20% to about 40% of the length of the plurality of light-emitting elements.

5. The display device of claim 3, wherein the insulating layer is in contact with the upper portions of the plurality of light-emitting elements and exposes second end portions of the plurality of light-emitting elements.

6. The display device of claim 5, wherein a thickness of the insulating layer is about 40% to about 70% of the length of the plurality of light-emitting elements.

7. The display device of claim 3, wherein second end portions of the plurality of light-emitting elements are in contact with the second electrode.

8. The display device of claim 1, wherein the plurality of light-emitting elements are spaced apart from one another at irregular intervals.

9. The display device of claim 1, wherein a length of the plurality of light-emitting elements is smaller than a thickness of the bank.

10. The display device of claim 2, wherein second end portions of the plurality of light-emitting elements protrude above a top surface of the insulating layer.

11. The display device of claim 2, wherein second end portions of the plurality of light-emitting elements are aligned and coincide with a top surface of the insulating layer.

12. The display device of claim 1, further comprising:
   a reflective electrode between the first electrode and the plurality of light-emitting elements, wherein the reflective electrode is in contact with a top surface of the first electrode and side surfaces of the bank.

13. The display device of claim 12, wherein the insulating layer covers the reflective electrode.

14. The display device of claim 1, wherein
each of the plurality of light-emitting elements comprises a first semiconductor layer, a second semiconductor layer, and at least one light-emitting layer between the first semiconductor layer and the second semiconductor layer, and
the first semiconductor layer, the second semiconductor layer, and the at least one light-emitting layer are surrounded by an insulating film.

15. A method of manufacturing a display device, the method comprising:
growing a plurality of light-emitting elements on a base substrate;
attaching a polymer film comprising porogen on the plurality of light-emitting elements;
forming a polymer layer, which surrounds first end portions of the plurality of light-emitting elements, by heat-treating the base substrate to melt the polymer film;
separating the plurality of light-emitting elements and mixing the plurality of light-emitting elements in light-emitting element ink comprising a conductive polymer;
preparing a target substrate, comprising a first electrode and a bank, and applying the light-emitting element ink on the first electrode;
forming a conductive polymer layer on the first electrode by drying the light-emitting element ink, and aligning the plurality of light-emitting elements vertically with respect to the first electrode;
forming an insulating layer on the conductive polymer layer;
removing the polymer layer from the plurality of light-emitting elements; and
forming a second electrode on the plurality of light-emitting elements.

16. The method of claim 15, wherein
the polymer film is fabricated with a polymer resin composition comprising a polymer resin and the porogen,
the polymer resin is in an amount of about 15% to about 30% by weight with respect to 100% by weight of the polymer resin composition, and
the porogen is in an amount of about 10% to about 40% by weight with respect to 100% by weight of the polymer resin.

17. The method of claim 15, wherein the light-emitting element ink is prepared by mixing the plurality of light-emitting elements, the conductive polymer, and a solvent.

18. The method of claim 15, wherein the light-emitting element ink and the insulating layer are applied by inkjet printing.

19. The method of claim 15, wherein
if the light-emitting element ink is applied on the first electrode, the polymer layer formed at the first end portions of the plurality of light-emitting elements floats above a surface of the light-emitting element ink and the plurality of light-emitting elements are aligned vertically with respect to the first electrode, and
in the drying the light-emitting element ink, the conductive polymer is formed into a conductive polymer layer, and the plurality of light-emitting elements are settled on the first electrode in a state of being aligned vertically with respect to the first electrode.

20. A method of manufacturing a display device, the method comprising:
growing a plurality of light-emitting elements on a base substrate;
attaching a polymer film comprising porogen on the plurality of light-emitting elements;
forming a polymer layer, which surrounds first end portions of the plurality of light-emitting elements, by heat-treating the base substrate to melt the polymer film;
separating the plurality of light-emitting elements and mixing the plurality of light-emitting elements in light-emitting element ink comprising a conductive polymer;
preparing a substrate comprising a first electrode and a bank;
forming a reflective material layer on the first electrode and the bank;
applying the light-emitting element ink on the reflective material layer;
aligning a conductive polymer layer and the plurality of light-emitting elements on the reflective material layer by drying the light-emitting element ink;
etching away the polymer layer from the plurality of light-emitting elements, and forming a reflective electrode by etching the reflective material layer;
forming an insulating layer on the conductive polymer layer and the reflective electrode; and
forming a second electrode on the plurality of light-emitting elements.

* * * * *